United States Patent
Kobayashi et al.

(10) Patent No.: US 11,936,251 B2
(45) Date of Patent: Mar. 19, 2024

(54) ELECTRIC COMPRESSOR WITH INVERTER CIRCUIT SECTION AND FILTER CIRCUIT SECTION

(71) Applicant: SANDEN AUTOMOTIVE COMPONENTS CORPORATION, Isesaki (JP)

(72) Inventors: Mikio Kobayashi, Isesaki (JP); Masataka Matsuda, Isesaki (JP); Toru Yoshihara, Isesaki (JP)

(73) Assignee: SANDEN AUTOMOTIVE COMPONENTS CORPORATION, Gunma (JP)

( * ) Notice: Subject to any disclaimer, the term of this patent is extended or adjusted under 35 U.S.C. 154(b) by 884 days.

(21) Appl. No.: 16/969,860

(22) PCT Filed: Jan. 21, 2019

(86) PCT No.: PCT/JP2019/002599
§ 371 (c)(1),
(2) Date: Aug. 13, 2020

(87) PCT Pub. No.: WO2019/163406
PCT Pub. Date: Aug. 29, 2019

(65) Prior Publication Data
US 2020/0381981 A1    Dec. 3, 2020

(30) Foreign Application Priority Data
Feb. 23, 2018  (JP) ................................. 2018-031171

(51) Int. Cl.
*H02K 11/33*    (2016.01)
*H02K 11/02*    (2016.01)
(Continued)

(52) U.S. Cl.
CPC ............. *H02K 11/33* (2016.01); *H02K 11/02* (2013.01); *H03H 1/0007* (2013.01);
(Continued)

(58) Field of Classification Search
CPC .... H02K 11/33; H02K 11/02; H02K 2211/03; H02K 2203/03; H03H 1/0007;
(Continued)

(56) References Cited

U.S. PATENT DOCUMENTS 8,441,160 B2 *  5/2013  Watanabe ............. H02M 7/003
                                                       310/71
10,923,982 B2 *  2/2021  Iketaka .................... H02K 5/18
(Continued)

FOREIGN PATENT DOCUMENTS

CN    111502997    8/2020
JP    2001-210392  8/2001
(Continued)

OTHER PUBLICATIONS

Attached translated foreign patent Kobayashi Mikio et al. JP2017172509 A . (Year: 2017).*
(Continued)

*Primary Examiner* — Emily P Pham
(74) *Attorney, Agent, or Firm* — Cozen O'Connor

(57) ABSTRACT

Assembly workability of an electric compressor to which an inverter circuit section and a filter circuit section are attached is improved. The inverter circuit section (3) includes an inverter control board (17), a sleeve assembly (18), and a power module (14). The inverter control board, the sleeve assembly, and the power module are integrated. The filter circuit section (4) includes a filter circuit board (66) and a support member (67). The filter circuit board (66) and the support member (67) are integrated. The inverter circuit section and the filter circuit section are structured to
(Continued)

be capable of being stored each individually within an inverter storing section (8) from the same direction and detachably attached to the housing (2).

5 Claims, 20 Drawing Sheets

(51) Int. Cl.
| | |
|---|---|
| *H03H 1/00* | (2006.01) |
| *H03H 7/01* | (2006.01) |
| *H05K 1/18* | (2006.01) |
| *B60H 1/32* | (2006.01) |
| *H01L 25/07* | (2006.01) |

(52) U.S. Cl.
CPC ............ *H03H 7/0115* (2013.01); *H05K 1/18* (2013.01); *B60H 1/3223* (2013.01); *H01L 25/072* (2013.01); *H02K 2211/03* (2013.01); *H05K 2201/10166* (2013.01); *H05K 2201/10378* (2013.01); *H05K 2201/10522* (2013.01); *H05K 2201/10568* (2013.01); *H05K 2201/10606* (2013.01); *H05K 2201/10757* (2013.01); *H05K 2201/10901* (2013.01)

(58) Field of Classification Search
CPC .................. H03H 7/0115; H05K 1/18; H05K 2201/10166; H05K 2201/10378; H05K 2201/10522; H05K 2201/10568; H05K 2201/10606; H05K 2201/10757; H05K 2201/10901; B60H 1/3223; H01L 25/072; F04B 39/121; F04B 35/04; F04B 39/14

USPC .......................................................... 310/72
See application file for complete search history.

(56) References Cited

U.S. PATENT DOCUMENTS

| | | | | |
|---|---|---|---|---|
| 2003/0200761 | A1* | 10/2003 | Funahashi | ........... F04C 29/0085 |
| | | | | 62/228.4 |
| 2005/0223727 | A1* | 10/2005 | Funahashi | ............. F04B 39/121 |
| | | | | 62/228.4 |
| 2012/0045353 | A1 | 2/2012 | Watanabe et al. | |
| 2014/0076434 | A1 | 3/2014 | Fukasaku et al. | |
| 2015/0349613 | A1 | 12/2015 | Hattori et al. | |

FOREIGN PATENT DOCUMENTS

| | | | | |
|---|---|---|---|---|
| JP | 2009-088913 | | 4/2009 | |
| JP | 2009088913 | * | 4/2009 | ............. H01F 37/00 |
| JP | 2009-97473 | | 5/2009 | |
| JP | 2010-084669 | | 4/2010 | |
| JP | 2017-172509 | | 9/2017 | |
| JP | 2017172509 | * | 9/2017 | ............. F04B 39/00 |

OTHER PUBLICATIONS

Attached translated foreign patent Watanabe Eiji et al. JP2009088913 A . (Year: 2009).*
Office Action dated Sep. 1, 2021 issued in German Patent Application No. 11 2019 000 423.9.
Office Action dated Sep. 3, 2021 issued in Chinese Patent Application No. 201980013800.8.
Notice of Reasons for Refusal dated Jun. 15, 2021 issued in Japanese Patent Application No. 2018-031171.

* cited by examiner

ELECTRIC COMPRESSOR WITH INVERTER CIRCUIT SECTION AND FILTER CIRCUIT SECTION

RELATED APPLICATIONS

This is a U.S. National Phase Application under 35 USC 371 of International Application PCT/JP2019/002599 filed on Jan. 21, 2019.

This application claims the priority of Japanese application no. 2018-031171 filed Feb. 23, 2018, the entire content of which is hereby incorporated by reference.

TECHNICAL FIELD

The present invention relates to an electric compressor in which a motor is incorporated in a housing.

BACKGROUND ART

Heretofore, as an electric compressor used for an air conditioning device for vehicles, an inverter-integrated electric compressor has been used in which an inverter circuit section is installed in an inverter storing section constituted on the outer surface of a housing in consideration of switching noise. In this case, since the space of the inverter storing section of the electric compressor must be reduced as much as possible, it is also necessary to reduce the volume of the inverter circuit section.

For this reason, there has heretofore been proposed a structure in which a bus bar assembly connected to a high heat radiation board on which a power switching element is mounted and a control board on which a control circuit is mounted is prepared, and the bus bar assembly is sandwiched and integrated between the two boards and attached to an inverter storing section in its state (refer to, for example, Patent Document 1).

CITATION LIST

Patent Document

Patent Document 1: Japanese Patent Application Publication No. 2017-172509

SUMMARY OF THE INVENTION

Problems to be Solved by the Invention

Here, the inverter circuit section is also provided with a filter mold assembly including electric components such as a smoothing capacitor for absorbing a high frequency component of a switching current, etc. However, in the above-described conventional constitution, since the filter mold assembly has been assembled to the inverter storing section in a state in which the filter mold assembly is attached to the inverter circuit section, the degree of freedom for the process of assembly is small, and work such as alignment also become complicated.

The present invention has been developed to solve such conventional technical problems, and an object thereof is to improve assembly workability of an electric compressor to which an inverter circuit section and a filter circuit section are attached.

Means for Solving the Problems

An electric compressor of the present invention includes a housing having a motor incorporated therein, an inverter circuit section for supplying power to the motor, and a filter circuit section for absorbing a high frequency component of a switching current and is constituted to install the inverter circuit section and the filter circuit section in an inverter storing section constituted on an outer surface of the housing, and is characterized in that the inverter circuit section includes an inverter control board on which a control circuit is mounted, a sleeve assembly having a plurality of terminal connection portions, and a power module on which power switching elements are mounted, and the inverter control board, the sleeve assembly, and the power module are integrated, in that the filter circuit section includes a filter circuit board on which electric components are mounted, and a support member which stores the electric components, and the filter circuit board and the support member are integrated by filling a thermosetting resin in the support member in a state in which the electric components are stored in the support member, and in that the inverter circuit section and the filter circuit section are structured to be capable of being stored each individually in the inverter storing section from the same direction and detachably attached to the housing.

The electric compressor of item 2 is characterized in that in the above invention, the inverter storing section is constituted on one end side of the housing in the axial direction of the motor, and the inverter circuit section and the filter circuit section are structured to be capable of being stored each individually in the inverter storing section from the axial direction of the motor and detachably attached to the housing.

The electric compressor of item 3 is characterized in that in the above respective inventions, a motor side connection terminal connected to a lead terminal of the motor and a filter side connection terminal of the filter circuit section are respectively fixed to terminal connection portions of the sleeve assembly and electrically connected to the inverter control board.

The electric compressor of item 4 is characterized in that in the above invention, each of the terminal connection portions is included a male screw having a screw groove portion, the sleeve assembly is resin-molded, and the terminal connection portions are integrally resin-molded in a state in which the screw groove portions are protruded.

The electric compressor of item 5 is characterized in that in the above invention, the motor side connection terminal and the filter side connection terminal are fastened to the terminal connection portions via the inverter control board by nuts screwed into the screw groove portions of the terminal connection portions.

The electric compressor of item 6 is characterized in that in item 4 or 5, sleeves through which bolts for fixing the inverter circuit section to the housing are inserted are integrally resin-molded in the sleeve assembly.

Advantageous Effect of the Invention

According to the present invention, in an electric compressor including a housing having a motor incorporated therein, an inverter circuit section for supplying power to the motor, and a filter circuit section for absorbing a high frequency component of a switching current and in which the inverter circuit section and the filter circuit section are installed in an inverter storing section constituted on an outer surface of the housing, the inverter circuit section includes an inverter control board on which a control circuit is mounted, a sleeve assembly having a plurality of terminal connection portions, and a power module on which power switching elements are mounted. These inverter control board, sleeve assembly and power module are integrated, and the filter circuit section includes a filter circuit board on which electric components are mounted, and a support member which stores the electric components. The filter circuit board and the support member are integrated by filling a thermosetting resin in the support member in a state in which the electric components are stored in the support member. The above inverter circuit section and filter circuit section are structured to be capable of being stored each individually in the inverter storing section from the same direction and detachably attached to the housing. Therefore, the inverter circuit section and the filter circuit section can be stored each separately in the inverter storing section. Thus, the degree of freedom in assembling process when the inverter circuit section and the filter circuit section are attached to the housing can be increased, and the assembly workability of the electric compressor can be improved.

In this case, since the soldering of the inverter circuit section, the soldering of the filter circuit section, and the resin filling can be performed in a sub line before the assembly to the housing, man-hours in a main line can be reduced. Further, since the inverter circuit section and the filter circuit section are provided separately, the degree of freedom in design is increased in their arrangement, and a space for the inverter storing section can be saved. Furthermore, since the relatively large filter circuit section is provided separately from the inverter circuit section, vibration resistance is also improved.

In particular, since the inverter circuit section and the filter circuit section can be stored in the inverter storing section from the same direction, there is no need to change the orientation of the housing when attaching the inverter circuit section and the filter circuit section to the housing, and the assembly work becomes even better.

For example, as in item 2, the inverter storing section is constituted on one end side of the housing in the axial direction of the motor, and the inverter circuit section and the filter circuit section are stored each individually in the inverter storing section from the axial direction of the motor and detachably attached to the housing. Consequently, the inverter circuit section and the filter circuit section can be easily installed in the inverter storing section from above with the one end side of the housing facing upward.

Further, as in item 3, motor side connection terminals connected to lead terminals of the motor and filter side connection terminals of the filter circuit section are fixed to the terminal connection portions of the sleeve assembly respectively, and electrically connected to the inverter control board. Consequently, the electrical connection of the inverter control board, the motor, and the filter circuit section can also be performed without any trouble.

In this case, as in item 4, each of the terminal connection portions is constituted of a male screw having a screw groove portion, the sleeve assembly is resin-molded, and the respective terminal connection portions are integrally resin-molded in a protruded state of each screw groove portion. Consequently, the rigidity of the sleeve assembly and the terminal connection portions is increased, and vibration resistance is remarkably improved.

Then, as in item 5, the motor side connection terminals and the filter side connection terminals are fastened to the respective terminal connection portions via the inverter control board by nuts screwed into the screw groove portions of the terminal connection portions, so that the motor side connection terminals and the filter side connection terminals are firmly fastened, thereby making it possible to improve the connection strength and rigidity and provide a constitution resistant to vibration.

Further, as in item 6, if the sleeve though which each bolt for fixing the inverter circuit section to the housing is inserted is integrally resin-molded in the sleeve assembly, the sleeve is integrated with the sleeve assembly, thereby making it possible to reduce the number of components and improve the rigidity of the inverter circuit section.

MODE FOR CARRYING OUT THE INVENTION

Figure 1:
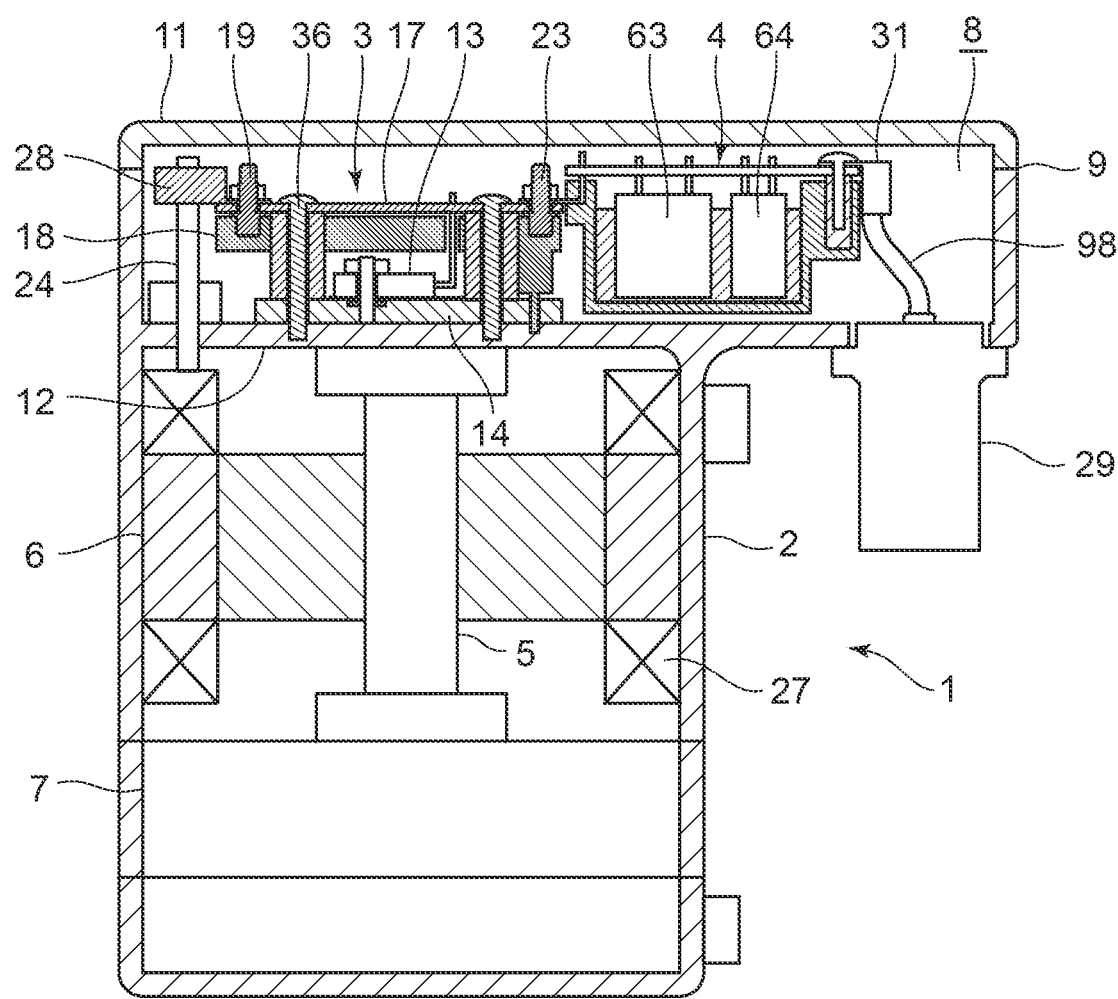
FIG. 1 is a vertical sectional side view of an inverter-integrated electric compressor of an embodiment to which the present invention is applied.
Figure 2:
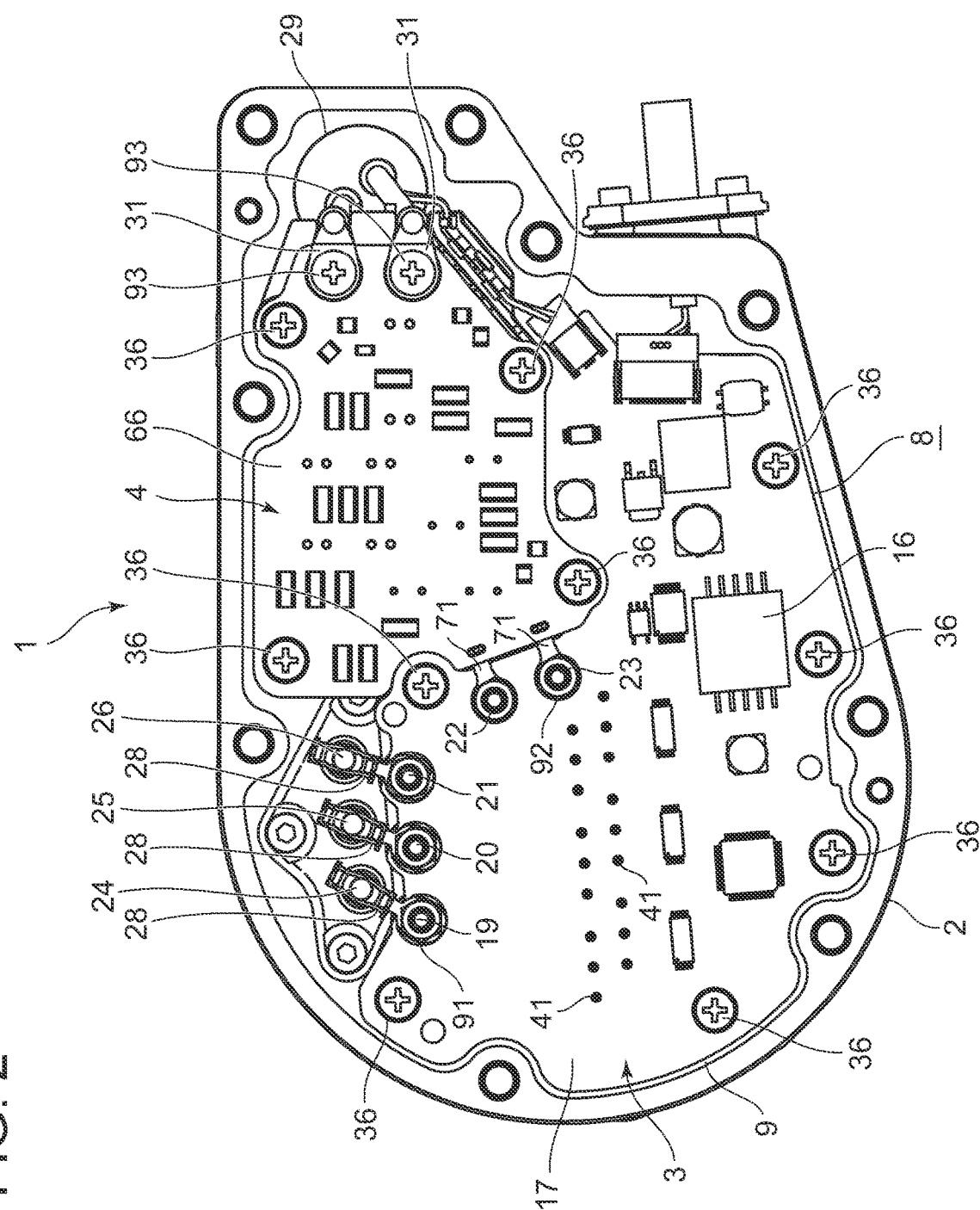
FIG. 2 is a plan view of a state in which a lid member of the electric compressor is detached, as seen from the side (one end side) of an inverter storing section.
Figure 3:
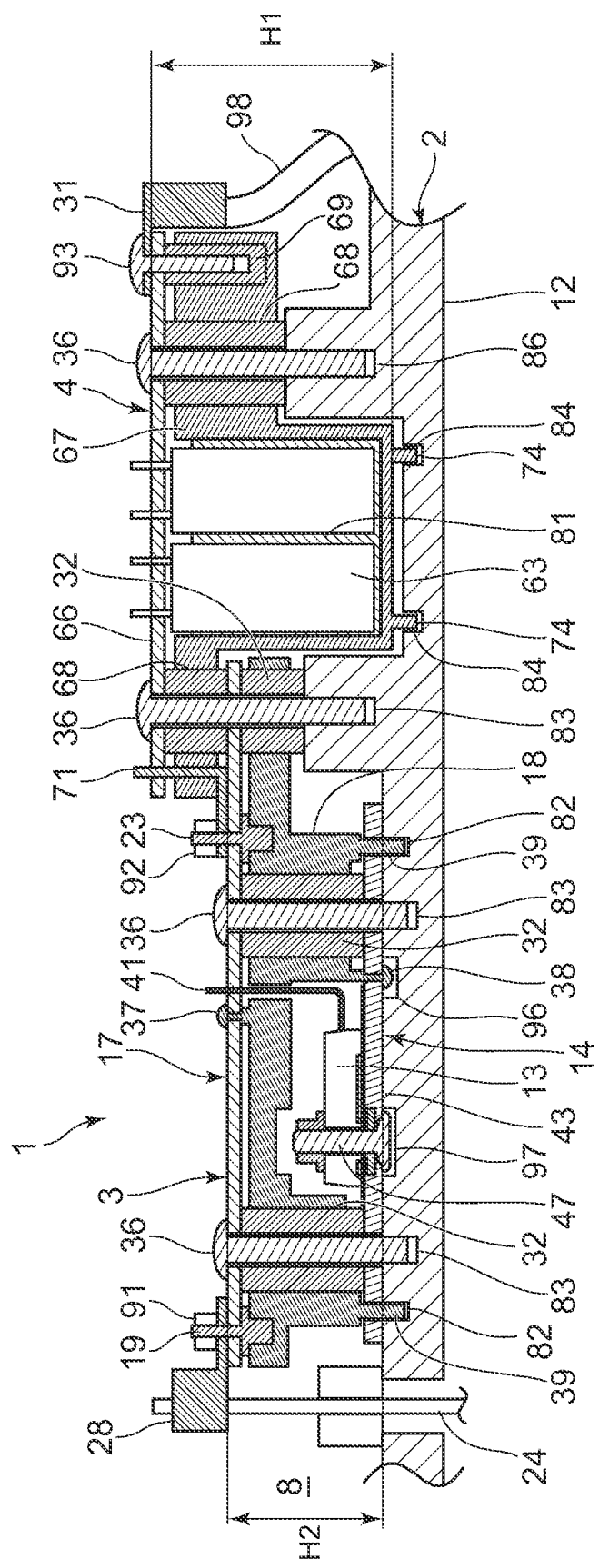
FIG. 3 is an enlarged vertical sectional side view of a part of the inverter storing section of the electric compressor of FIG. 1.

Hereinafter, an embodiment of the present invention will be described in detail with reference to the drawings. FIG. 1 is a vertical sectional side view of an electric compressor 1 according to an embodiment to which the present invention is applied, FIG. 2 is a plan view of a state in which a lid member 11 of the electric compressor 1 is detached, as seen from the side (one end side) of an inverter storing section 8, and FIG. 3 is an enlarged vertical sectional side view of a portion of the inverter storing section 8 of the electric compressor 1.

(1) Overall Constitution of Electric Compressor 1

The electric compressor 1 according to the embodiment is a so-called inverter-integrated electric compressor, and constitutes a part of a refrigerant circuit of a vehicle air conditioning device which conditions air of a vehicle interior of an unillustrated vehicle. The electric compressor 1 includes a motor 6, a housing 2 in which a compression mechanism 7 to be driven by a rotating shaft 5 of the motor 6 is incorporated, an inverter circuit section 3 which drives the motor 6, and a filter circuit section 4 as an electric circuit section for absorbing a high frequency component of a switching current.

An inverter storing section 8 which is disposed on one end side of the motor 6 in an axial direction of the rotating shaft 5 and serves as a storing section is constituted on the outer surface of the housing 2 in the embodiment. An opening 9 of the inverter storing section 8 is openably closed by the lid member 11. Then, the inverter circuit section 3 and the filter circuit section 4 are constituted to be stored each individually in the inverter storing section 8 from the axial direction of the rotating shaft 5 of the motor 6 and detachably attached to the housing 2.

It is to be noted that the respective figures illustrate the electric compressor 1 of the embodiment in a state in which the inverter storing section 8 is shown on the upside, but in actual, the electric compressor 1 is disposed in a lateral direction so that the inverter storing section 8 is disposed on one side.

The motor 6 of the embodiment is constituted of a three-phase synchronous motor (a brushless DC motor) and the compression mechanism 7 is, for example, a scroll type compression mechanism. The compression mechanism 7 is driven by the rotating shaft 5 of the motor 6 to compress a refrigerant, thereby discharging the refrigerant into the refrigerant circuit. Then, a low-temperature gas refrigerant sucked from an evaporator (also referred to as a heat absorber) also constituting a part of the refrigerant circuit flows through the housing 2. Therefore, the inside of the housing 2 is cooled. Further, the inverter storing section 8 is separated from the inside of the housing 2 in which the motor 6 is housed, by a partition wall 12 which serves as a bottom face of the inverter storing section 8, and the partition wall 12 is also cooled by the low-temperature gas refrigerant.

(2) Constitution of Inverter Circuit Section 3

Next, the constitution of the inverter circuit section 3 will be described with reference to FIGS. 4 to 13. The inverter circuit section 3 has a power module 14 on which six power switching elements 13 (IGBT in the embodiment) constituting arms of respective phases of a three-phase inverter circuit are mounted, an inverter control board 17 on which a control circuit 16 is mounted, and a resin-made sleeve assembly 18 having a plurality of (five in the embodiment) terminal connection portions 19, 20, 21, 22, and 23.

The inverter circuit section 3 converts DC power supplied from a battery of the unillustrated vehicle to three-phase AC power to supply the power to a stator coil 27 of the motor 6. Therefore, connection points between the power switching elements 13 on an upper arm side of each phase and the power switching elements 13 on a lower arm side thereof are respectively connected to lead terminals 24, 25, and 26 extending out from the partition wall 12 of the housing 2 and projecting in the axial direction via three motor side connection terminals (connection terminals) 28. Power source terminals of the power switching elements 13 on the upper arm side and ground terminals of the power switching elements 13 on the lower arm side are connected to a power source harness from the above-described battery via the filter circuit section 4 and a connector (HV) 29 for high power.

In this case, the lead terminals 24 to 26 each of which is connected to the connection point between the power switching element 13 on the upper arm side of each phase and the power switching element 13 on the lower arm side thereof extend through the partition wall 12 to be connected to the stator coil 27 of the motor 6 in the housing 2. Further, the power source terminals and the ground terminals are electrically connected to the power source harness via the filter circuit section 4, power source side connection terminals (connection terminals) 31 respectively provided at the leading ends of two wires 98 extending out from the aforementioned high power connector 29, and the high power connector 29, and others.

(2-1) Constitution of Sleeve Assembly 18

Figure 6:
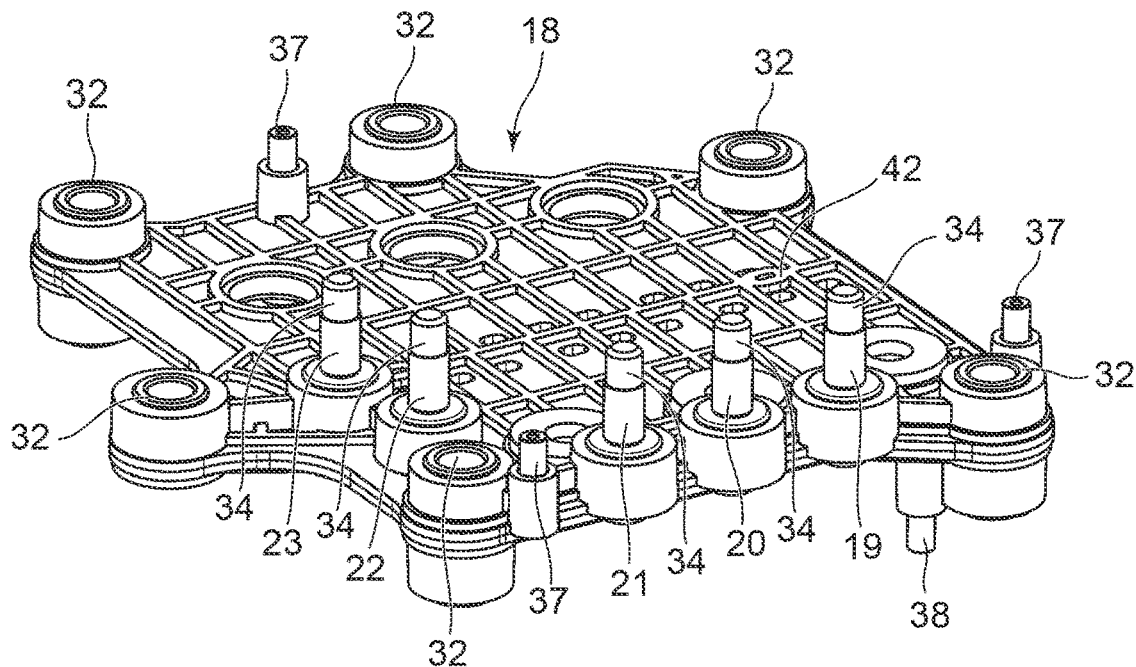
FIG. 6 is a perspective view of a sleeve assembly of the inverter circuit section of FIG. 4.
Figure 7:
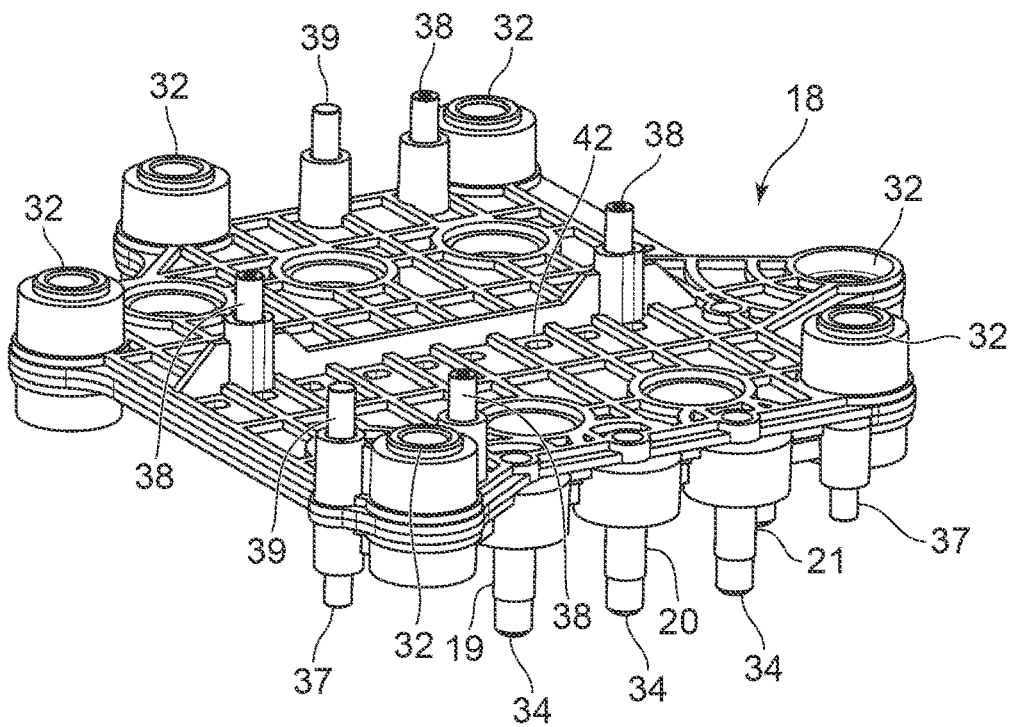
FIG. 7 is a perspective view of a back surface of the sleeve assembly of FIG. 6.
Figure 8:
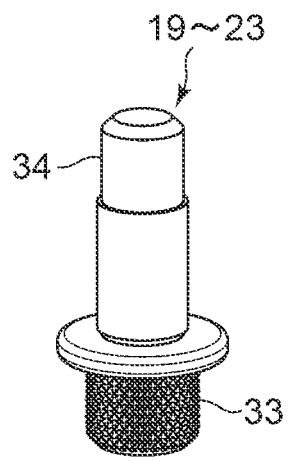
FIG. 8 is a perspective view of a terminal connection portion of the sleeve assembly of FIG. 6.
Figure 9:
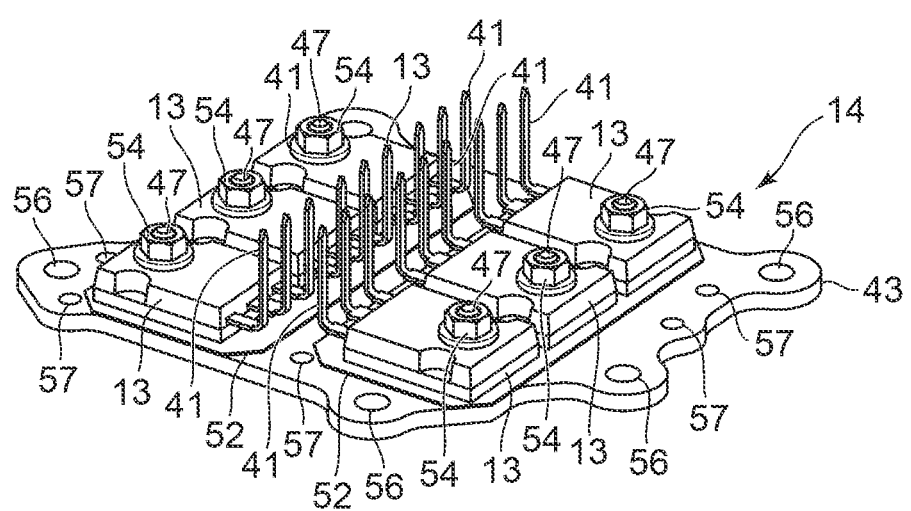
FIG. 9 is a perspective view of a power module of the inverter circuit section of FIG. 4.

Next, the constitution of the sleeve assembly 18 will be described with reference to FIGS. 6 to 8. The aforementioned five terminal connection portions 19, 20, 21, 22, and 23 are projected from the sleeve assembly 18, and the sleeve assembly 18 further has six sleeves 32. Any of the terminal connection portions 19 to 23 is constituted of a metal-made male screw as shown in FIG. 8 in the embodiment and has an embedded portion 33 (which becomes a screw head) having fine irregularities formed on the outer surface thereof, and a screw groove portion 34 protruding from the embedded portion 33. Further, the sleeve 32 is made of a metal cylinder having a predetermined length dimension.

Then, these terminal connection portions 19 to 23 and the sleeves 32 are resin-molded integrally with the sleeve assembly 18 by insert molding of an insulating hard resin. At this time, only the embedded portions 33 of the respective terminal connection portions 19 to 23 are embedded into the hard resin of the sleeve assembly 18, and the screw groove portion 34 is in a state of being protruded upward from the surface of the sleeve assembly 18. Also, the terminal connection portions 19 to 21 are arranged at positions on the lead terminals 24 to 26 sides, and the terminal connection portions 22 and 23 are arranged at positions on the filter circuit section 4 side. Further, each sleeve 32 is disposed in a peripheral portion of the sleeve assembly 18 and has upper and lower ends exposed and opened to the surface of the sleeve assembly 18 and its back surface, and enables a bolt 36 for fixing to the housing 2 to be described later to be inserted therethrough.

Also, positioning pins 37 with respect to the inverter control board 17 are three protruded and formed integrally by a hard resin at predetermined positions on the surface of the sleeve assembly 18. Further, positioning pins 38 with respect to the power module 14 are four protruded and formed integrally by a hard resin at predetermined positions on the back surface of the sleeve assembly 18. Furthermore, positioning pins 39 with respect to the housing 2 are two protruded and formed integrally by a hard resin at predetermined positions on the back surface of the sleeve assembly 18.

Further, insertion holes 42 for causing terminals 41 for sources, emitters, and drains of the respective power switching elements 13 mounted to the power module 14 to pass therethrough are formed in plural (18 spots) at the center part of the sleeve assembly 18. Then, as will be described later, the sleeve assembly 18 has a predetermined thickness dimension enough only to allow an insulation distance (the shortest insulation distance) between the inverter control board 17 and the power module 14 (an installation plate 43 to be described later) to be at least ensured.

(2-2) Constitution of Power Module 14

The constitution of the power module 14 will be described with reference to FIGS. 9 to 12. The power module 14 is constituted by mounting the six power switching elements 13 on the installation plate 43 constituted of a metal plate (aluminum in the embodiment) having high heat radiation. In this case, fitting holes 44 exist in the installation plate 43 three by three at predetermined intervals and are formed six in total in two rows to extend therethrough, and counterbore portions 46 are respectively recess-formed in the surfaces of the respective fitting holes 44.

Figure 11:
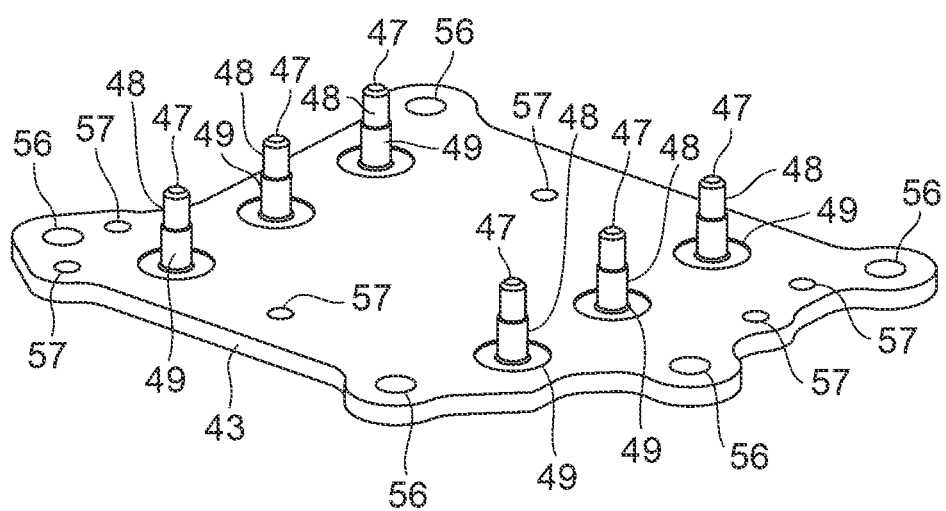
FIG. 11 is a perspective view of an installation plate of the power module of FIG. 9.
Figure 12:
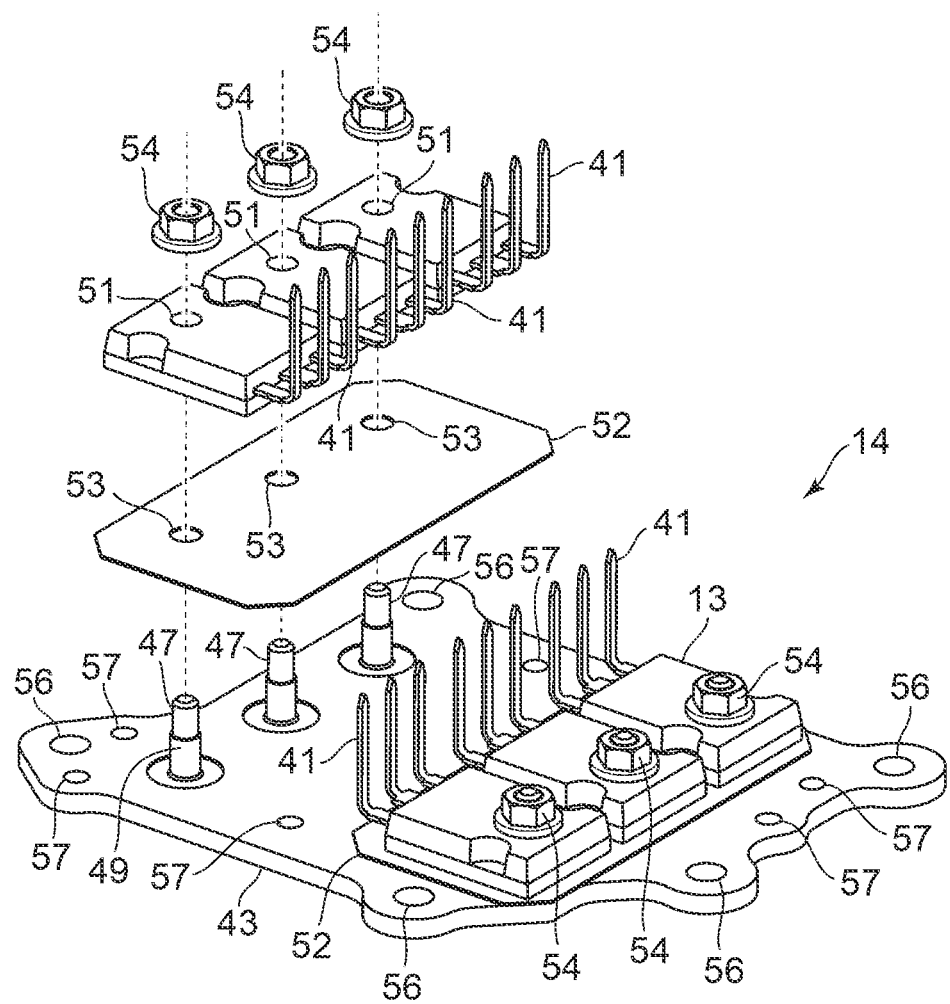
FIG. 12 is an exploded perspective view of the power module of FIG. 9.

Then, a male screw 47 is press-fit in and fixed to each fitting hole 44 from the back surface side thereof, and vertically disposed on the installation plate 43. In each male screw 47, a screw groove portion 48 thereof protrudes from the surface of the installation plate 43 in its fitted state, and each of resin coating materials 49 is mold-formed on the outer surface of the male screw 47 at the portion other than the screw groove portion 48 of each male screw 47 inclusive of the counterbore portion 46. In this state, the resin coating materials 49 respectively covers the male screws 47 in a state in which the screw groove portions 48 of the male screws 47 are exposed (FIG. 11).

On the other hand, the power switching elements 13 are respectively formed with through holes 51. Then, each power switching element is disposed on the installation plate 43 (its surface) through an insulating sheet 52 in the form to allow each mail screw 47 to penetrate through the through hole 51. In this case, the insulating sheets 52 are two used in the form to extend over the power switching elements 13 of each row. Each insulating sheet 52 is also formed with through holes 53 three by three. Each male screw 47 penetrates through the through hole 53 of the insulating sheet 52 and the through hole 51 of the power switching element 13, and the screw groove portion 48 protrudes from the power switching element 13.

Figure 10:
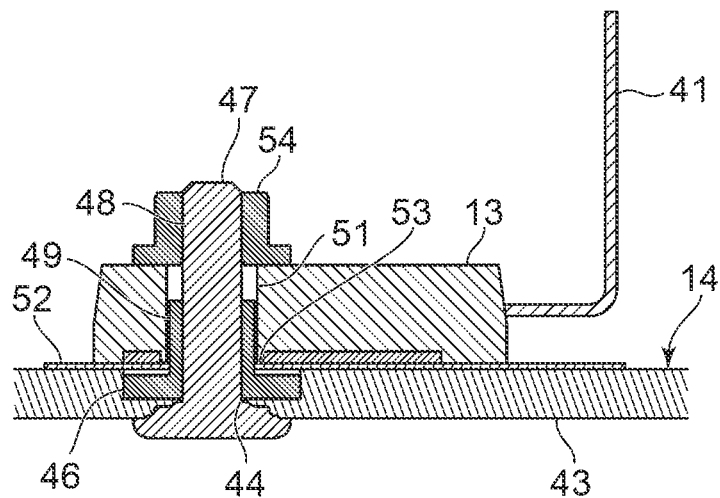
FIG. 10 is a vertical sectional side view of a switching element part of the power module of FIG. 9.

Further, in the state in which the respective power switching elements 13 are disposed on the installation plate 43, the terminals 41 of the power switching elements 13 of each row are adjacent to each other in the center part of the installation plate 43 and bent to be directed in an upward direction from the installation plate 43 (in a direction to rise from the surface thereof). In this state, a nut 54 is screwed into the screw groove portion 48 of each male screw 47 to thereby fasten and fix each power switching element 13 to the installation plate 43, thus constituting the power module 14. In this state, the resin covering material 49 is interposed between the power switching element 13 and the insulating sheet 52 and the male screw 47 (FIG. 10).

Incidentally, when the nut 54 threadedly engages with the male screw 47, a predetermined jig is used to prevent each power switching element 13 from rotating. Thus, the six male screws 47 provided upright on the installation plate 43, and the resin covering materials 49 respectively covering the male screws 47 in the state in which the screw groove portions 48 of the male screws 47 are exposed, are provided. The power switching elements 13 and the insulating sheet 52 are disposed on the installation plate 43 in the state in which the male screws 47 are penetrated therethrough, and fixed to the installation plate 43 by the nuts 54 screwed into the screw groove portions 48, so that the respective power switching elements 13 are mounted onto the installation plate 43 through the insulating sheet 52, thereby constituting the power module 14. Thus, each male screw 47 performs a role of positioning the power switching element 13 and the insulating sheet 52 to the installation plate 43.

Consequently, since assembly workability is remarkably improved, and a special positioning means is not required to be provided either, a reduction in size can also be achieved. In particular, since the resin covering material 49 is interposed between the power switching element 13 and the insulating sheet 52 and the male screw 47 in the state in which they are fixed to the installation plate 43 by the nuts 54, insulation between the male screw 47 and the power switching element 13 can also be ensured without any hindrance.

In particular, in the embodiment, since each male screw 47 is press-fitted and fixed to the installation plate 43, and the resin coating material 49 is mold-shaped on the outer surface of the male screw 47, it is possible to achieve a further improvement in assembly workability and significantly contribute even to an improvement in space saving.

Incidentally, in the peripheral portion of the installation plate 43, insertion holes 56 are five formed at positions corresponding to the predetermined sleeves 32 of the sleeve assembly 18 described above. Further, positioning holes 57 are six formed penetratingly at the positions corresponding to the positioning pins 38 and 39 formed on the back surface of the sleeve assembly 18.

(2-3) Constitution of Inverter Control Board 17

The control circuit 16 of the inverter control board 17 performs switching control of each power switching element 13 of the power module 14 based on an external command. Further, the control circuit has a function of transmitting a drive state of the motor 6 to the outside, and is constituted by connecting each circuit component such as a microcomputer via a printed wire.

Further, in the peripheral portion of the inverter control board 17, terminal connection holes 58 are five formed at positions corresponding to the terminal connection portions 19, 20, 21, 22, and 23 of the sleeve assembly 18 described above. In addition, insertion holes 59 are eight formed in the peripheral portion of the inverter control board 17 inclusive of positions corresponding to the respective sleeves 32 of the sleeve assembly 18. Furthermore, positioning holes 61 are three formed penetratingly at positions respectively corresponding to the positioning pins 37 formed on the surface of the sleeve assembly 18. Additionally, a plurality of terminal connection holes 62 (18 spots) are formed even at positions corresponding to the respective insertion holes 42 of the sleeve assembly 18.

(2-4) Assembling Procedure of Inverter Circuit Section 3

Figure 13:
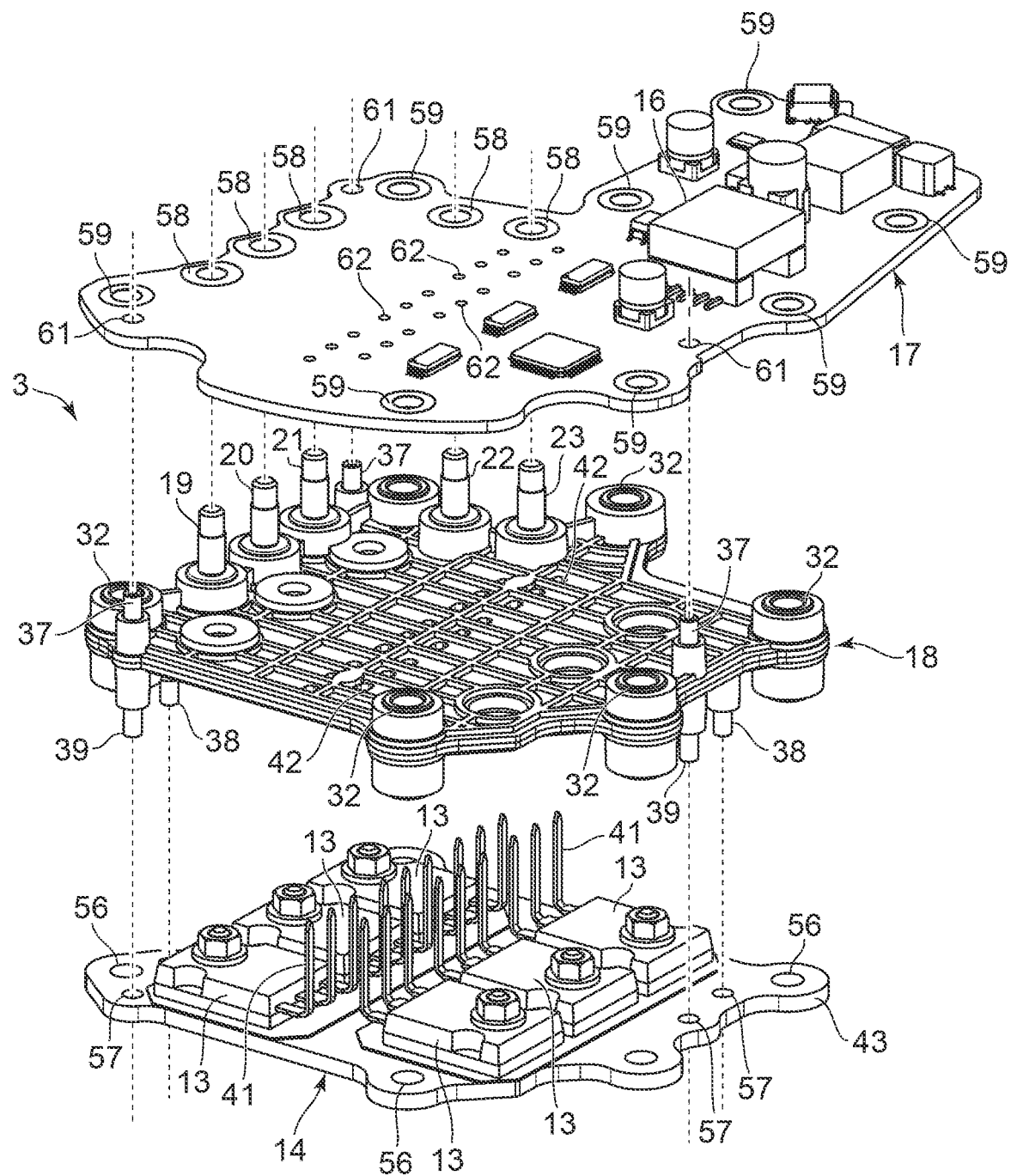
FIG. 13 is an exploded perspective view of the inverter circuit section of FIG. 4.

An assembling procedure of the inverter circuit section 3 will next be described in the above constitution. Incidentally, the inverter circuit section 3 integrates the inverter control board 17, the sleeve assembly 18, and the power module 14 in a sub line. At that time, first, as shown in FIG. 13, the inverter control board 17 on which the control circuit 16 is mounted is taken as the upper side, the power module 14 on which each power switching element 13 is mounted is taken as the lower side, and these inverter control board 17, sleeve assembly 18 and power module 14 are sequentially stacked in a state in which the sleeve assembly 18 is interposed by these inverter control board 17 and power module 14.

At this time, the positioning pins 37 on the surface of the sleeve assembly 18 respectively enter the positioning holes 61 of the inverter control board 17 and protrude from the inverter control board 17. The positioning pins 38 and 39 on the back surface of the sleeve assembly 18 respectively enter the positioning holes 57 of the power module 14 and protrude from the power module 14, so that the positions of the three parties are determined with high accuracy.

In this stacked state, each insertion hole 56 of the power module 14 corresponds to the back surface side of the five sleeves 32 of the sleeves 32 of the sleeve assembly 18. The six insertion holes 59 of the insertion holes 59 of the inverter control board 17 correspond to the surface side of each sleeve 32 of the sleeve assembly 18. Also, the terminal connection portions 19 to 23 provided in the sleeve assembly 18 pass through the terminal connection holes 58 formed in the inverter control board 17 and protrude to the surface side of the inverter control board 17. Further, the terminals 41 of the respective power switching elements 13 of the power module 14 pass through the respective insertion holes 42 of the sleeve assembly 18 and protrude slightly from the terminal connection holes 62 of the inverter control board 17 to the surface side of the inverter control board 17.

In this state, each positioning pin 37 projecting from the inverter control board 17 and each positioning pin 38 projecting from the power module 14 are heat caulked, whereby the inverter control board 17, the sleeve assembly 18, and the power module 14 are made integral. Further, the terminal 41 of the power switching element 13 protruding from each terminal connection hole 62 is soldered to the inverter control circuit board 17 to electrically connect the power switching element 13 and the inverter control board 17.

Figure 4:
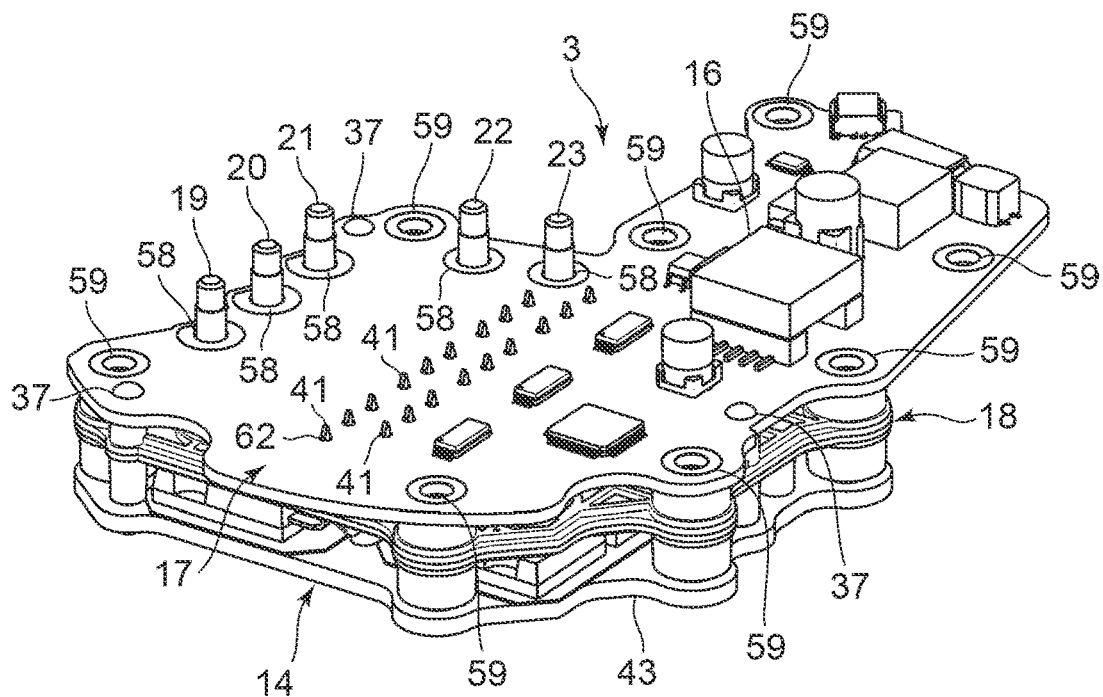
FIG. 4 is a perspective view of an inverter circuit section of the electric compressor of the electric compressor of FIG. 1.
Figure 5:
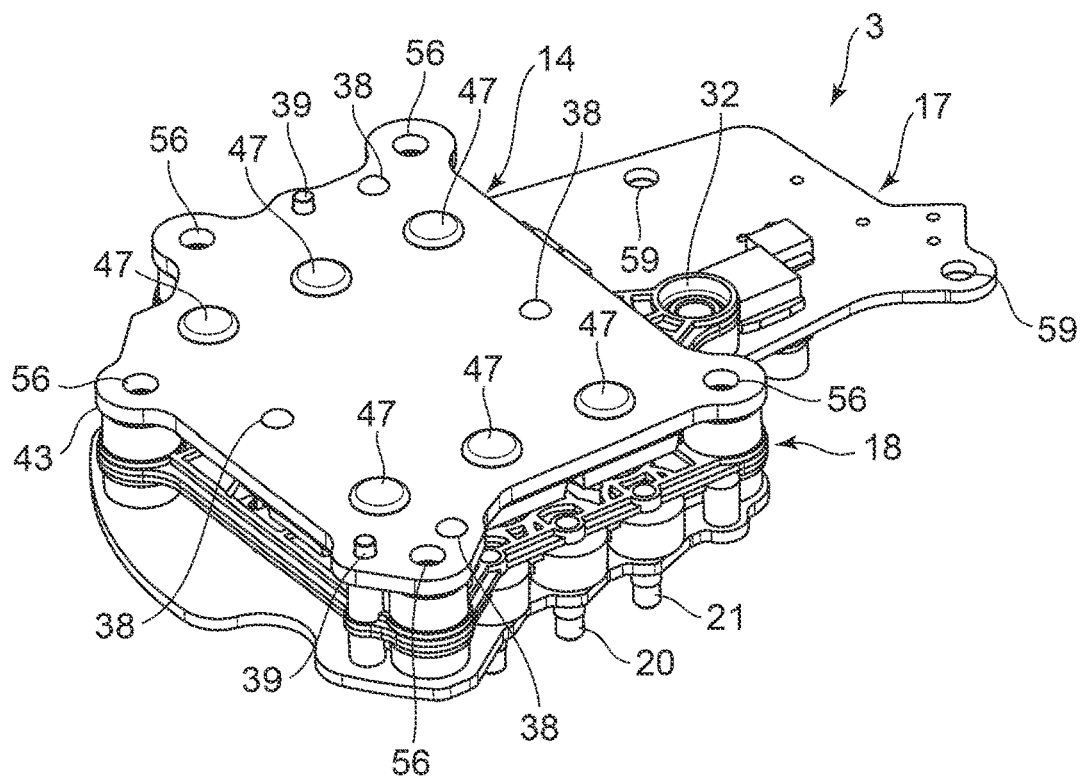
FIG. 5 is a perspective view of a back surface of the inverter circuit section of FIG. 4.

By such heat caulking and soldering, the inverter control board 17, the sleeve assembly 18, and the power module 14 are integrated in a sub line (FIGS. 4 and 5). At this time, since the resin-made sleeve assembly 18 has a predetermined thickness dimension, the sleeve assembly 18 serves as a spacer interposed between the inverter control board 17 and the power module 14. The insulation distance between the inverter control board 17 and the power module 14 is ensured at the shortest.

As described above, the positioning pins 37 and 38 relative to the inverter control board 17 and the power module 14 are provided on the sleeve assembly 18, and the positioning pins 37 and 38 are heat-caulked with the sleeve assembly 18 sandwiched between the inverter control board 17 and the power module 14, whereby the inverter control board 17, the sleeve assembly 18, and the power module 14 are integrated. This therefore eliminates the need for special fasteners such as screws for integrating the inverter control board 17, the sleeve assembly 18, and the power module 14 of the inverter circuit section 3 and enables a reduction in the number of components and a reduction in weight to be realized.

Further, by not using the fasteners such as the screws, it is not necessary to secure an insulation distance from them either, and it is possible to contribute even to downsizing of the inverter circuit section 3. Further, since the resin-made sleeve assembly 18 is interposed between the inverter control board 17 and the power module 14 in the integrated state, the insulation distance between the inverter control board 17 and the power module 14 is ensured to be shortest. In addition, since the influence of the heat generated from the power switching element 13 of the power module 14 on the inverter control board 17 can also be blocked by the resin-made sleeve assembly 18, miniaturization can be realized also by these.

Then, the sleeve assembly 18 is provided with the terminal connection portions 19 to 23 made of the male screws having the screw grooves portions 34, and the sleeves 32 into which the bolts 36 for fixing the inverter circuit section 3 to the housing 2 are inserted as will be described later, and the terminal connection portions 19 to 23 and the sleeves 32 are integrally resin-molded with the screw groove portions 34 being protruded. Therefore, the sleeve assembly 18 and the inverter circuit section 3 become a structure high in rigidity, thereby making it possible to improve vibration resistance.

(3) Constitution of Filter Circuit Section 4

Next, the constitution of the filter circuit section 4 will be described with reference to FIGS. 14 to 21. The filter circuit section 4 is constituted of a filter circuit board 66 as a circuit board on which electric components such as a relatively large smoothing capacitor (electrolytic capacitor) 63 connected between the power source terminal and the installation terminal of the three-phase inverter circuit, a coil 64 also being relatively large, which is connected to the power source terminal, etc. are mounted, and a support member 67 made of a hard resin which accommodates these capacitor 63 and coil 64 (electric components) therein.

(3-1) Constitution of Support Member 67

Figure 18:
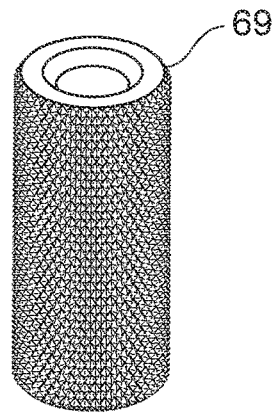
FIG. 18 is a perspective view of a nut member of the filter circuit section of FIG. 14.
Figure 19:
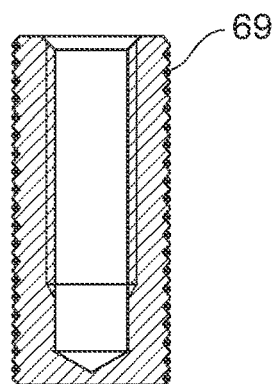
FIG. 19 is a vertical sectional side view of the nut member of FIG. 18.

The support member 67 has one surface which is open, and has a container (case) shape having a depth dimension sufficient to accommodate the smoothing capacitor 63 and the coil 64 which are large as described above. In a peripheral portion of the support member 67, five sleeves 68 each having a predetermined length dimension made of a metal cylinder are resin-molded integrally with the support member 67 by insert molding of an insulating hard resin, exposed on the front and back surfaces of the support member 67, and made open. In addition, two bag-shaped metal nut members 69 having fine irregularities formed on the outer surfaces thereof as shown in FIGS. 18 and 19 are similarly resin-molded integrally with the support member 67 on one end side of the support member 67, exposed on the surface of the support member 67 and made open. Then, the respective nut members 69 are arranged with predetermined intervals from each other.

Further, guide portions 76 are two formed on the edge of the support member 67 at a position corresponding to each nut member 69 so as to be hollowed out to the inner side. The guide portions 76 have a predetermined interval from each other. As will be described later, while restricting positional displacements when the two power source side connection terminals 31 are electrically connected to the filter circuit board 66, an insulation distance between the power source side connection terminals 31 is secured.

Figure 20:
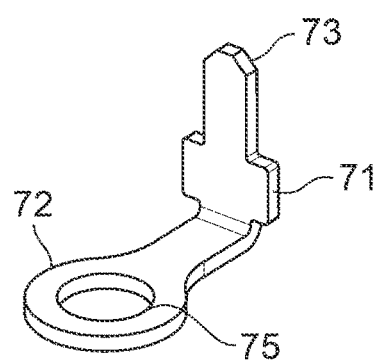
FIG. 20 is a perspective view of a filter side connection terminal of the filter circuit section of FIG. 14.

Furthermore, two filter side connection terminals (connection terminals) 71 are integrally resin-molded on the other end side of the support member 67 in the same manner. Each filter side connection terminal 71 has a flat plate terminal portion 72 having a hole 75 defined therein as shown in FIG. 20 and a soldering portion 73 bent at a right angle from the flat plate terminal portion 72. The flat plate terminal portion 72 protrudes laterally from the support member 67, and the soldering portion 73 is embedded in the support member 67 so as to protrude from its top surface. Further, a positioning pin 74 is formed to protrude from the bottom face of the support member 67.

(3-2) Constitution of Filter Circuit Board 66

The electric components such as the smoothing capacitor 63, the coil 64, etc. are mounted on the back surface side of the filter circuit board 66. Further, insertion holes 77 are four formed in the peripheral portion of the filter circuit board 66 at positions corresponding to the sleeves 68 of the support member 67 described above. Terminal connection holes 78 are two formed on one end side of the filter circuit board 66 at positions respectively corresponding to the nut members 69 of the support member 67. Further, terminal connection holes 79 are two formed on the other end side of the filter circuit board 66 at positions respectively corresponding to the filter side connection terminals 71 of the support member 67.

(3-3) Assembling Procedure of Filter Circuit Section 4

Figure 21:
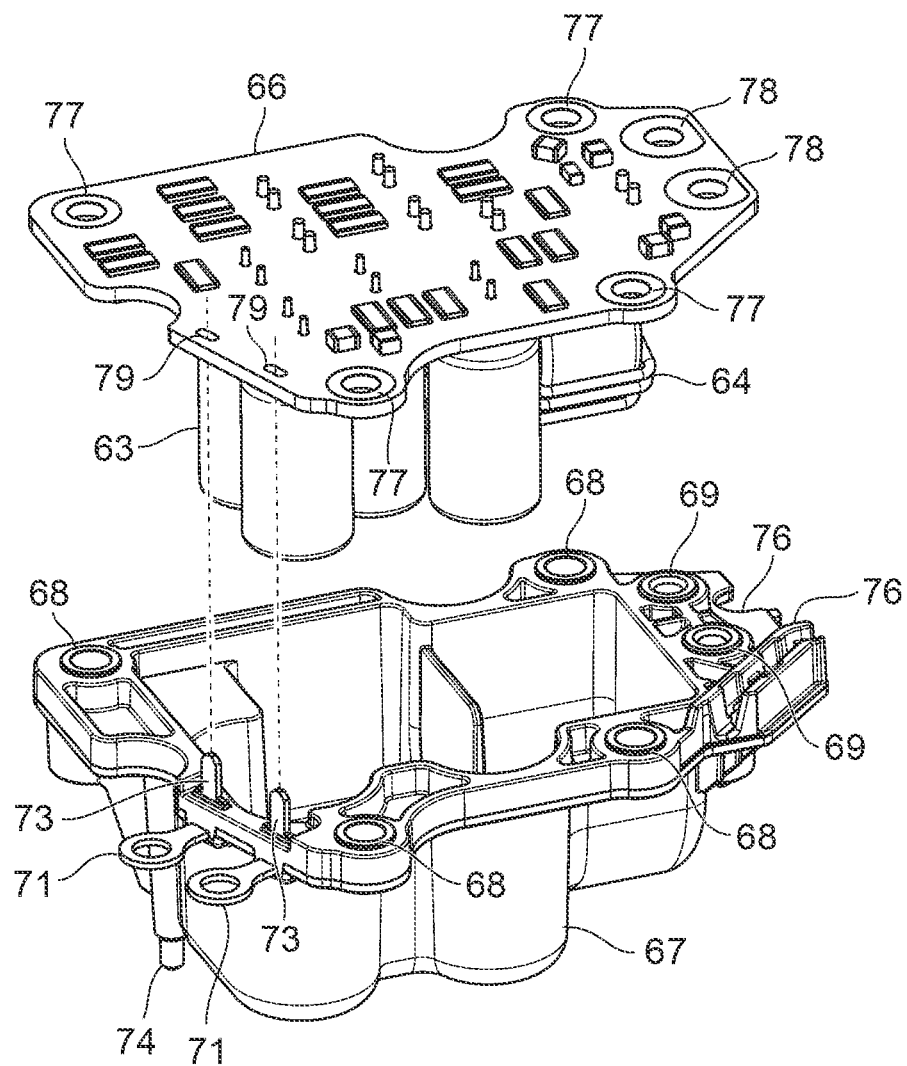
FIG. 21 is an exploded perspective view of a filter circuit board of the filter circuit section of FIG. 14 and the support member thereof.

Next, the assembling procedure of the filter circuit section 4 will be described in the above constitution. Incidentally, the filter circuit section 4 also integrates the filter circuit board 66 and the support member 67 in a sub line. At that time, first, as shown in FIG. 21, the smoothing capacitor 63 and the coil 64 of the filter circuit board 66 are placed on the lower side, and these are accommodated in the support member 67.

At this time, the soldering portions 73 of the filter side connection terminals 71 respectively enter the terminal connection holes 79 of the filter circuit board 66 and protrude slightly from the filter circuit board 66, and the insertion holes 77 respectively correspond to the sleeves 68 of the support member 67. Further, the terminal connection holes 78 of the filter circuit board 66 respectively corresponds to the nut members 69 of the support member 67.

Figure 14:
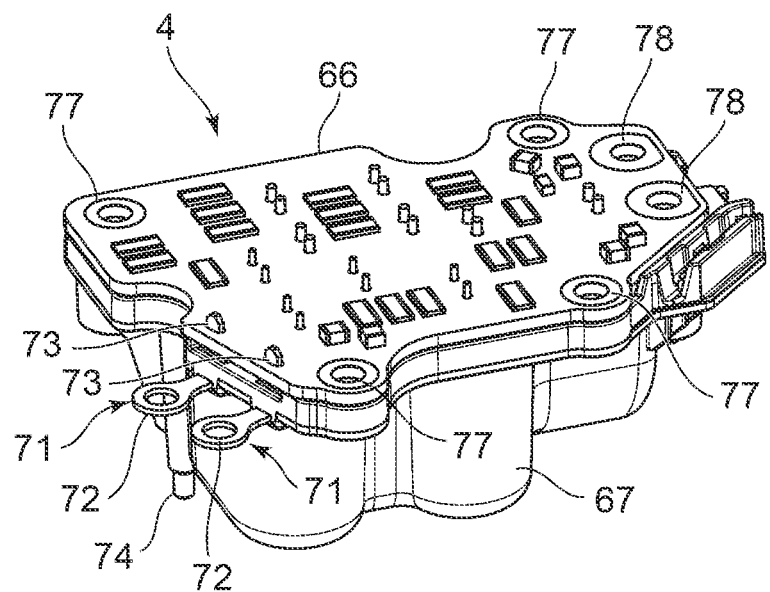
FIG. 14 is a perspective view of a filter circuit section of the electric compressor of FIG. 1.
Figure 15:
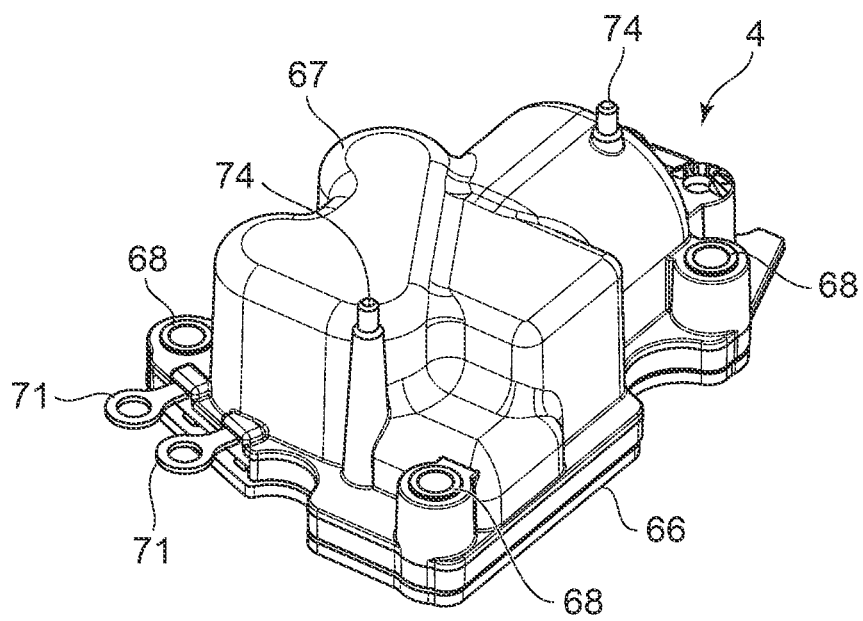
FIG. 15 is a perspective view of a back surface of the filter circuit section of FIG. 14.
Figure 16:
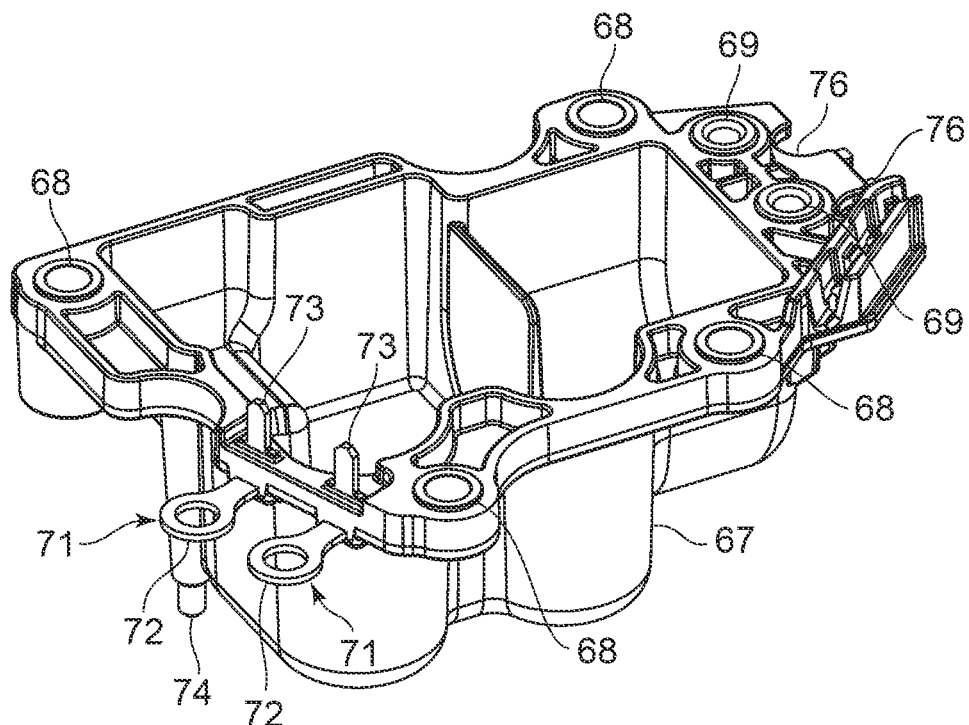
FIG. 16 is a perspective view of a support member of the filter circuit section of FIG. 14.
Figure 17:
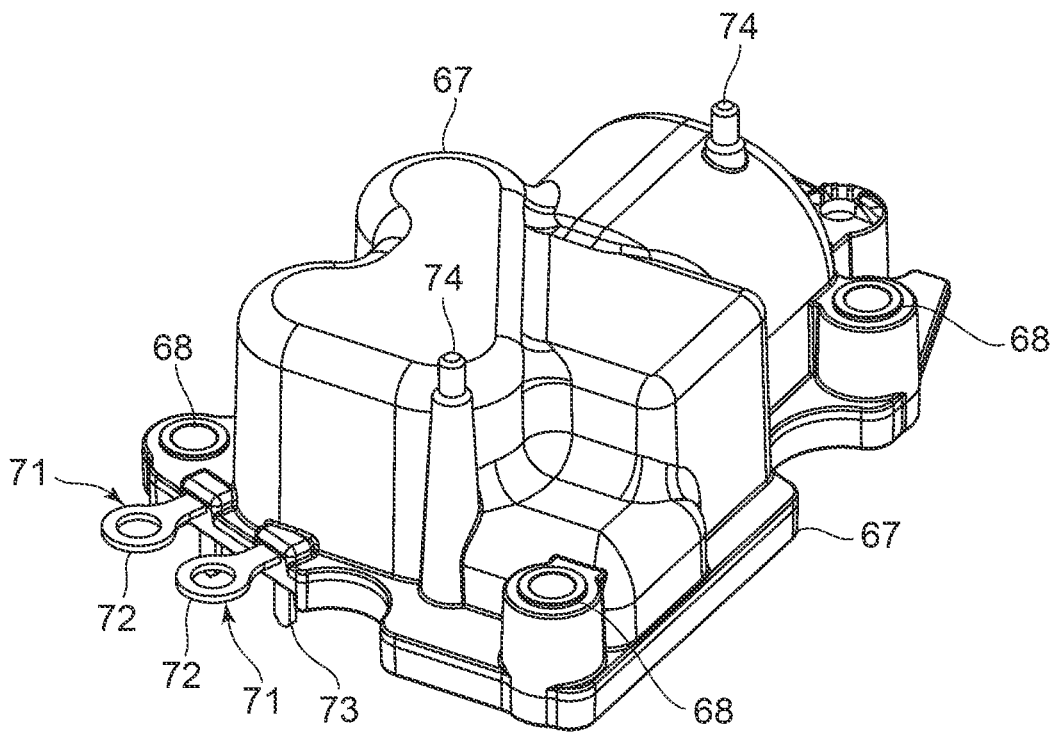
FIG. 17 is a perspective view of a back surface of the support member of FIG. 16.

In this state, the filter circuit board 66 and the support member 67 are integrated by filling the support member 67 with a thermosetting resin 81 (for example, an epoxy resin, which is shown in FIG. 3). Further, the soldering portion 73 of the filter side connection terminal 71 protruding from each terminal connection hole 79 is soldered to the filter circuit board 66 to be electrically connected to the filter circuit board 66. The filter circuit board 66 and the support member 67 are integrated in a sub line by filling and soldering of the thermosetting resin 81 like this (FIGS. 14 and 15). At this time, the lower end of the sleeve 68 (the end on the housing 2 side) is located at the center in the height direction of the filter circuit section 4 or in a region near the center (FIG. 3).

Thus, the filter circuit board 66 and the support member 67 are integrated by filling the support member 67 with the thermosetting resin 81 in the sub line in the state in which the smoothing capacitor 63 and the coil 64 are accommodated in the support member 67 of the filter circuit section 4. The filter side connection terminals 71 whose one ends are soldered to the filter circuit board 66 and whose other ends are electrically connected to the inverter circuit section 3 with the terminal connection portions 22 and 23 (male screws) and nuts 92 as will be described later are resin-molded integrally with the support member 67. Consequently, resin filling and soldering are performed before assembling to the housing 2, and at the time of assembling, only the screwing of the nuts 92 and the fastening of the bolts 36 may be performed, thereby significantly improving the assembly workability. Further, the filter side connection terminal 71 whose one end is soldered to the filter circuit board 66 is resin-molded integrally with the support member 67, so that it becomes a structure with high rigidity against vibration, and no stress is generated in the soldering portion even after the filter circuit section 4 is fixed to the housing 2.

(4) Attaching Procedure of Inverter Circuit Section 3 and Filter Circuit Section 4 to Housing 2

Figure 22:
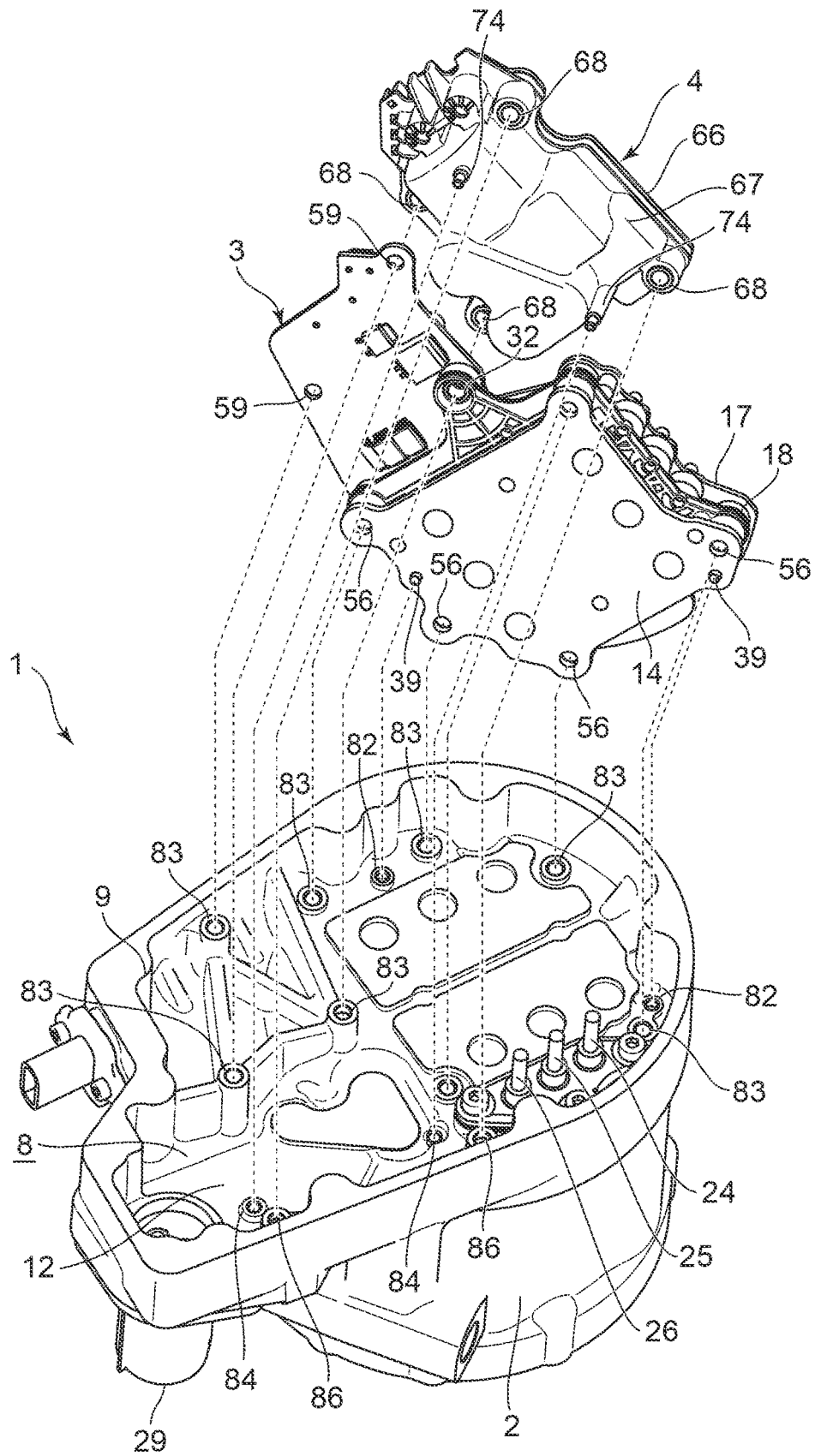
FIG. 22 is a diagram describing a procedure of attaching the inverter circuit section and the filter circuit section to the inverter storing section of the electric compressor of FIG. 1.
Figure 23:
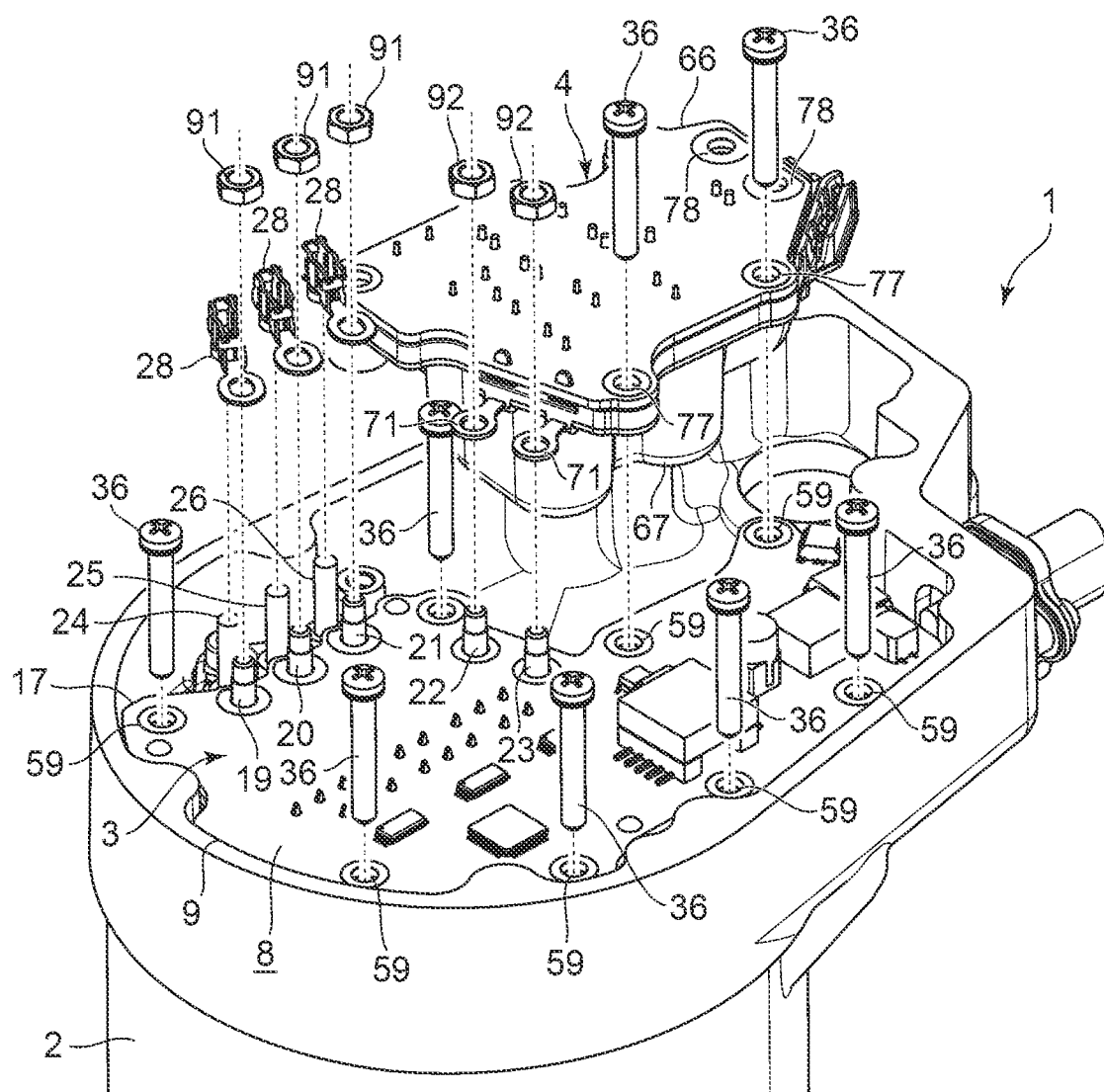
FIG. 23 is a diagram describing a procedure of attaching the inverter circuit section to the inverter storing section of the electric compressor of FIG. 1.
Figure 24:
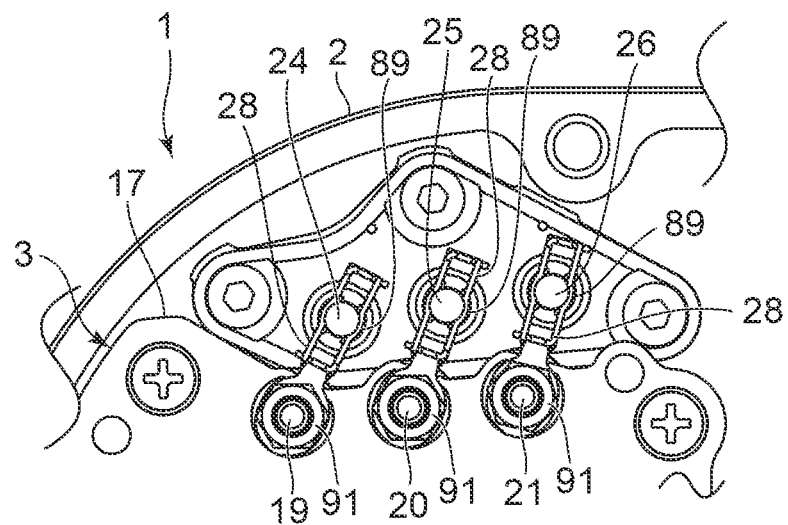
FIG. 24 is an enlarged plan view of the inverter storing section at a motor side connection terminal portion of the electric compressor of FIG. 1.
Figure 25:
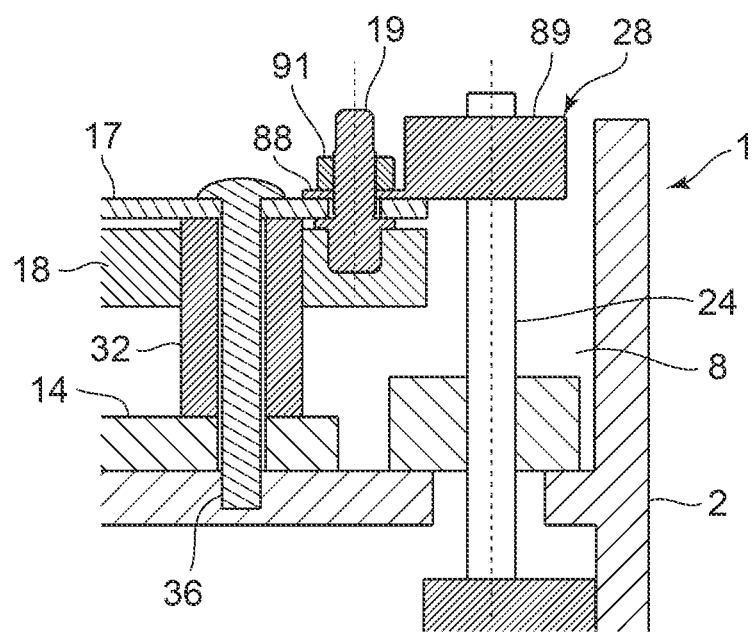
FIG. 25 is a vertical sectional side view of the inverter storing section at the motor side connection terminal portion of the electric compressor of FIG. 1.

Next, a procedure of attaching the inverter circuit section 3 and the filter circuit section 4 to the housing 2 in a main line will be described with reference to FIGS. 22 and 23. As shown in FIGS. 22 and 23, the housing 2 is arranged with one end side in the axial direction of the rotating shaft 5 of the motor 6 in which the inverter storing section 8 is constituted facing upward. Then, as described above, the inverter circuit section 3 and the filter circuit section 4 integrated with each other in the sub line are stored each separately in the inverter storing section 8 of the housing 2 similarly from the axial direction (above).

At this time, positioning recesses 82 are two formed in the partition wall 12 of the housing 2 serving as the bottom face of the inverter storing section 8 at positions corresponding to the positioning pins 39 of the inverter circuit section 3, respectively. Bolt fixing recesses 83 are eight formed at positions corresponding to the insertion holes 59 of the inverter control board 17 of the inverter circuit section 3. Then, as each positioning pin 39 enters the positioning recess 82, the position of the inverter circuit section 3 relative to the housing 2 is determined, and in that state, the insertion holes 59 (the sleeves 32 of the sleeve assembly 18, the insertion holes 56 of the power module 14) respectively correspond to the bolt fixing recesses 83 (FIG. 22).

In this state, since the installation plate 43 of the power module 14 contacts the partition wall 12 as shown in FIG. 3, the power switching element 13 is in a heat exchange relationship with the partition wall 12 through the installation plate 43 and is cooled by a low-temperature gas refrigerant. Incidentally, in FIG. 3, 96 is a recess formed in the partition wall 12 to escape the heat caulked positioning pin 38, and 97 is a recess formed in the partition wall 12 to escape the head of the male screw 47 of the installation plate 43.

On the other hand, in the partition wall 12 of the housing 2, positioning recesses 84 are two formed at positions respectively corresponding to the positioning pins 74 of the filter circuit section 4. Bolt fixing recesses 86 are two formed at positions corresponding to the two insertion holes 77 (sleeves 68) at the positions on the side opposite to the inverter circuit section 3, of the filter circuit section 4. Then, as each positioning pin 74 enters the positioning recess 84, the position of the filter circuit section 4 is determined with respect to the housing 2. Thus, the filter circuit section 4 and the housing 2 can be easily positioned by providing the support member 67 with the positioning pins 74 for the housing 2.

At that time, the two insertion holes 77 (sleeves 68) at the positions on the side opposite to the inverter circuit section 3 respectively correspond to the bolt fixing recesses 86, and each sleeve 68 contacts the housing 2 (partition wall 12) (FIG. 3). On the other hand, a part of the upper edge portion of the support member 67 on the inverter circuit section 3 side of the filter circuit section 4 is overlapped with the inverter circuit section 3, and the two insertion holes (sleeves 68) on the inverter circuit section 3 side correspond to the two insertion holes 59 of the inverter circuit section 3 respectively (FIG. 22).

Here, since the smoothing capacitor 63 and the coil 64 of the filter circuit section 4 are relatively large as described above, a height dimension H1 of the filter circuit section 4 becomes larger than a height dimension H2 of the inverter circuit section 3 as shown in FIG. 3. However, as in the embodiment, by detachably attaching the inverter circuit section 3 and the filter circuit section 4 to the housing 2 with the part of the filter circuit section 4 overlapped with the inverter circuit section 3, the filter circuit section 4 large in height dimension can be stored in and attached to the inverter storing section 8 without any trouble.

Further, as will be described later, the work of jointly fastening the filter side connection terminals 71 of the filter circuit section 4 (electric circuit section) to the terminal connection portions 22 and 23 of the sleeve assembly 18 with the inverter control board 17 and the nuts 92 can be also easily performed.

Incidentally, the sleeves 32 corresponding to the two insertion holes 59 abut against the housing 2 (partition wall 12) (FIG. 3). Further, the flat plate terminal portions 72 of the filter side connection terminals 71 of the filter circuit section 4 respectively correspond to the terminal connection portions 22 and 23 of the inverter circuit section 3, and each of the terminal connection portions 22 and 23 becomes a shape entering into the hole 75 of the flat plate terminal portion 72 of the filter side connection terminal 71.

After the inverter circuit section 3 and the filter circuit section 4 are thus arranged in the inverter storing section 8, the bolts 36 are inserted into the insertion holes 59 (sleeves 32 and insertion holes 56) of the inverter circuit section 3 and the insertion holes 77 (sleeves 68) of the filter circuit section 4 from the axial direction (above) (FIG. 23), screwed into the bolt fixing recesses 83 and 86 respectively, and then fastened, whereby the inverter circuit section 3 and the filter circuit section 4 are detachably attached to the housing 2 (FIGS. 2 and 3). In this state, the respective terminal connection portions 19, 20, and 21 of the inverter circuit section 3 are adjacent to the lead terminals 24, 25, and 26 respectively, and are protruded in the same axial direction (upward) as the lead terminals 24, 25, and 26.

(5) Connecting Procedure of Respective Connection Terminals 28, 31, and 71

Figure 26:
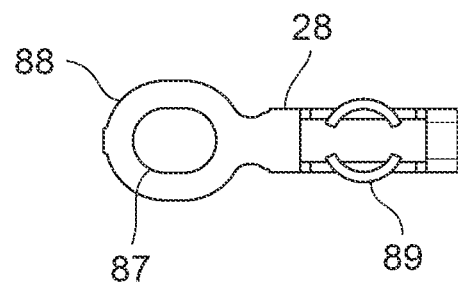
FIG. 26 is a plan view of a motor side connection terminal of the electric compressor of FIG. 1.
Figure 27:
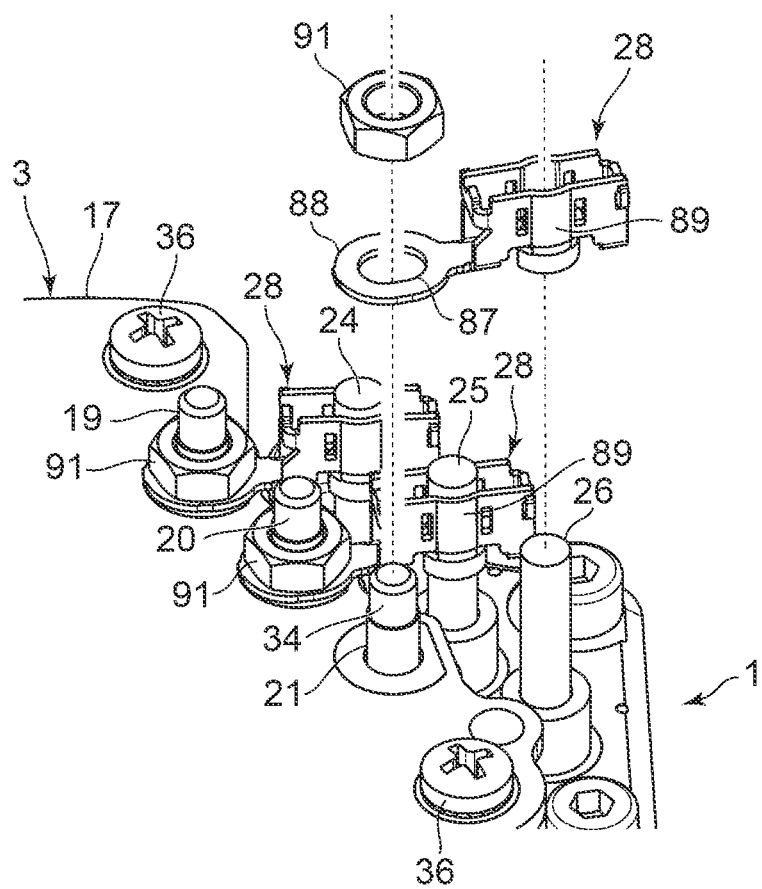
FIG. 27 is a diagram describing a procedure of attaching the motor side connection terminal of the electric compressor of FIG. 1.
Figure 28:
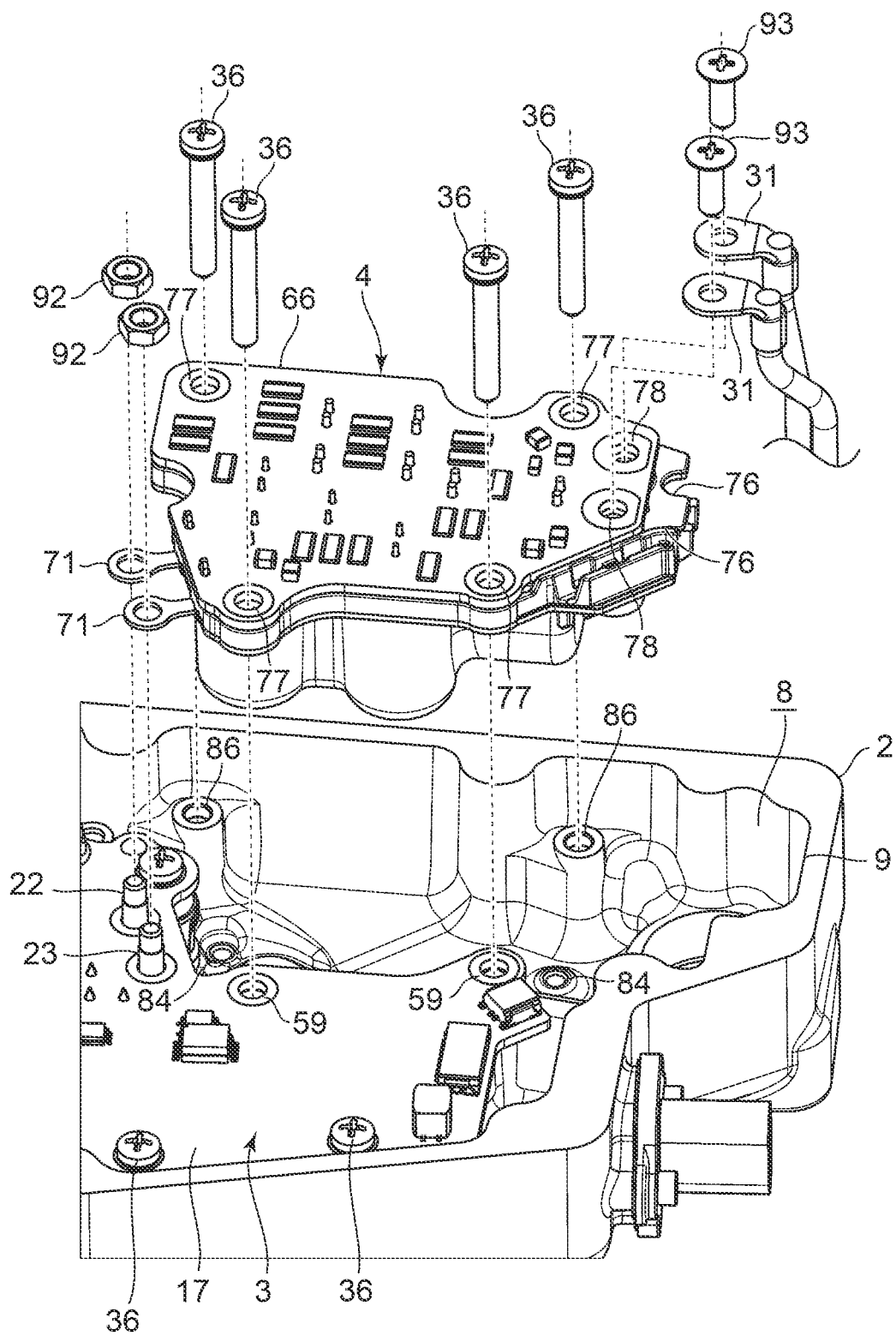
FIG. 28 is a diagram describing a procedure of attaching the filter circuit section to the inverter storing section of the electric compressor of FIG. 1.

Next, a connecting procedure of the motor side connection terminal 28, the power source side connection terminal 31, and the filter side connection terminal 71 (all of which are connection terminals) described above will be described with reference to FIGS. 24 to 31. The motor side connection terminal 28 is made of a metal plate, and as shown in FIG. 26, has a flat plate terminal portion 88 having a hole 87 defined on one end side, and a pressure contact terminal portion 89 having predetermined elasticity on the other end side.

Then, the three motor side connection terminals 28 are inserted into the inverter storing section 8 from the axial direction (above) of the housing 2, and the lead terminals 24, 25, and 26 are respectively press-fit into the pressure contact terminal portions 89 of the motor side connection terminals 28. Consequently, the pressure contact terminal portion 89 of each motor side connection terminal 28 is pressed against and electrically connected to each of the lead terminals 24 to 26. Further, the terminal connection portions 19, 20, and 21 are made to enter into the holes 87 of the flat plate terminal portions 88, so that the motor side connection terminals 28 are mounted between the lead terminal 24 and the terminal connection portion 19, the lead terminal 25 and the terminal connection portion 20, and the lead terminal 26 and the terminal connection portion 21 respectively.

In this state, the nut 91 is screwed into the screw groove portion 34 of each of the terminal connection portions 19 to 21 from above to thereby sandwich the flat plate terminal portion 88 of each motor side connection terminal 28 between the nut 91 and the inverter control board 17, whereby the flat plate terminal portion 88 and the inverter control board 17 are fastened together. Consequently, each motor side connection terminal 28 is fastened to each of the terminal connection portions 19 to 21 via the inverter control board 17. In this way, each motor side connection terminal 28 is fixed and electrically connected to the inverter control board 17, and the lead terminals 24 to 26 from the motor 6 are electrically connected to the inverter control board 17 by the motor side connection terminals 28.

Further, the nuts 92 are respectively screwed even into the screw groove portions 34 of the terminal connection portions 22 and 23 of the inverter circuit section 3 from above to thereby sandwich the flat plate terminal portions 72 of the filter side connection terminals 71 between the nuts 92 and the inverter control board 17, whereby the flat plate terminal portions 72 and the inverter control board 17 are fastened together. Thus, the filter side connection terminals 71 are fixed and electrically connected to the inverter control board 17, and the filter circuit board 66 of the filter circuit section 4 is electrically connected to the inverter control board 17 via the filter side connection terminals 71.

In this way, the inverter control board 17 and the filter side connection terminals 71 of the filter circuit section 4 are jointly fastened to the terminal connection portions 22 and 23 by the nuts 92 each screwed into the screw groove portion 34, and the inverter control board 17 and the filter circuit section 4 are electrically connected, so that the inverter control board 17 and the filter circuit section 4 can be connected with a highly rigid connection structure. Further, the inverter circuit section 3 and the filter circuit section 4 can be easily connected to each other and attached and removed to and from the housing 2.

In particular, since the filter side connection terminals 71 of the filter circuit section 4 can be directly connected to the inverter control board 17, it is possible to suppress costs by reducing the number of components. In addition, assembling and removal become easier than solder connection, and the sleeve assembly 18 and the inverter control board 17 are also integrated by being fastened together by the nuts 92, so that the rigidity of the inverter control board 17 can also be improved.

Figure 29:
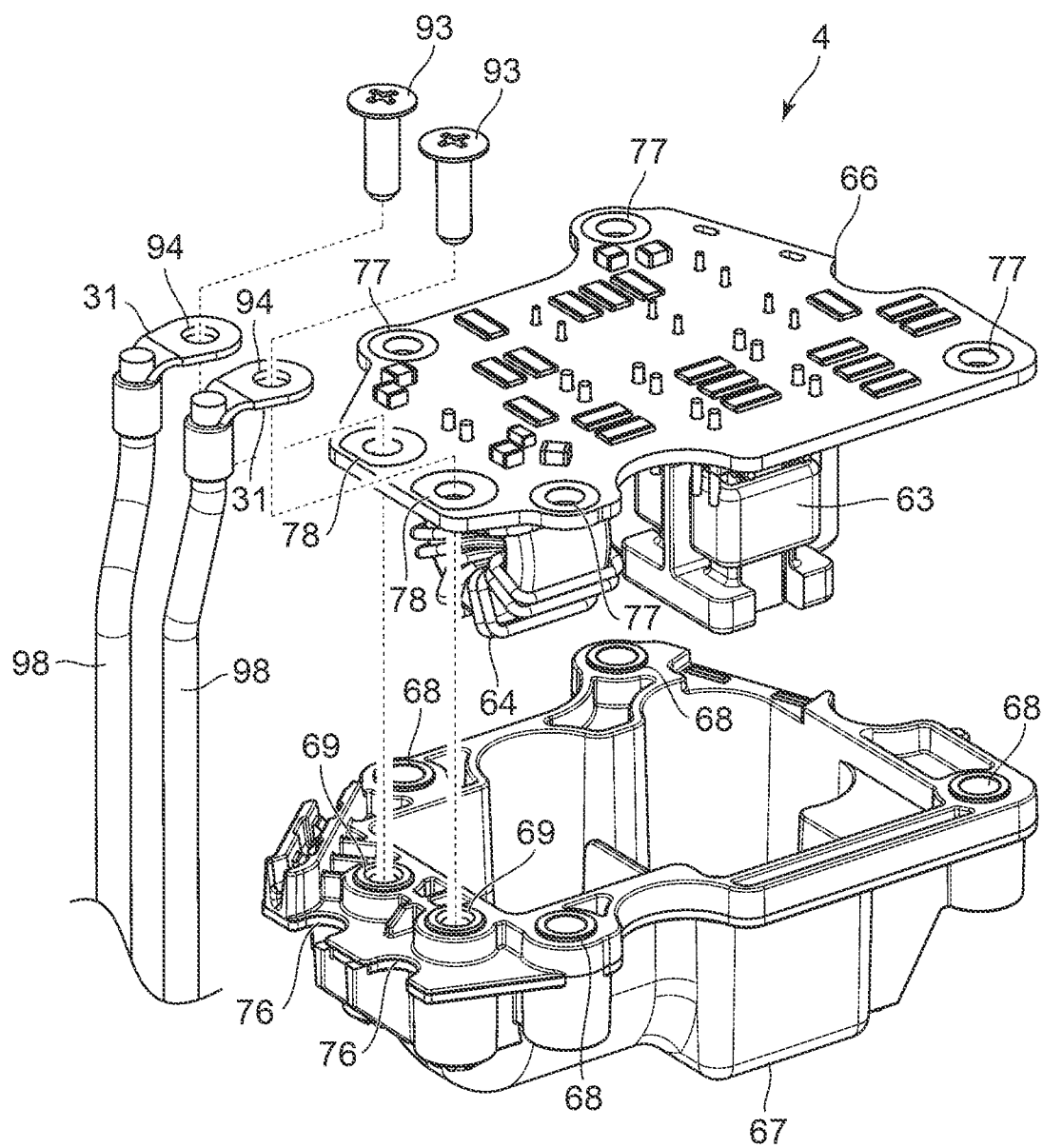
FIG. 29 is a diagram describing a procedure of attaching power source side connection terminals to the filter circuit section of FIG. 14.

Further, the two power source side connection terminals 31 described above are also flat plate terminals with holes 94 defined therein, and the holes 94 are made to correspond to the respective terminal connection holes 78 of the filter circuit section 4. As shown in FIG. 29, the screws 93 are inserted from the axial direction (above) and screwed into the nut members 69, whereby the power source side connection terminals 31 and the filter circuit board 66 are fastened together to the nut members 69. Consequently, the filter circuit board 66 and the power source side connection terminals 31 are electrically connected.

In this way, the bag-shaped nut members 69 are integrally resin-molded on the support member 67 of the filter circuit section 4, the filter circuit board 66 and the power source side connection terminals 31 are fastened together to the nut members 69 with the screws 93, and the filter circuit board 66 and the power source side connection terminals 31 are electrically connected. It is thus possible to connect the filter circuit board 66 and the power source side connection terminals 31 with a highly rigid connection structure.

In particular, since the power source side connection terminals 31 can be directly connected to the filter circuit board 66, it is possible to suppress costs by reducing the number of components. In addition, assembling and removal become easier than solder connection, and the support member 67 and the filter circuit board 66 are also integrated by fastening together by the screws 93, so that the rigidity of the filter circuit board 66 can also be improved.

Moreover, since the bag-shaped nut members 69 are used, waste produced when fastening together by the screws 93 can also be stored in the nut members 69. The occurrence of inconveniences such as circuit shortening, electric leakage, etc. which are caused by diffusion of the waste can also be prevented.

Figure 30:
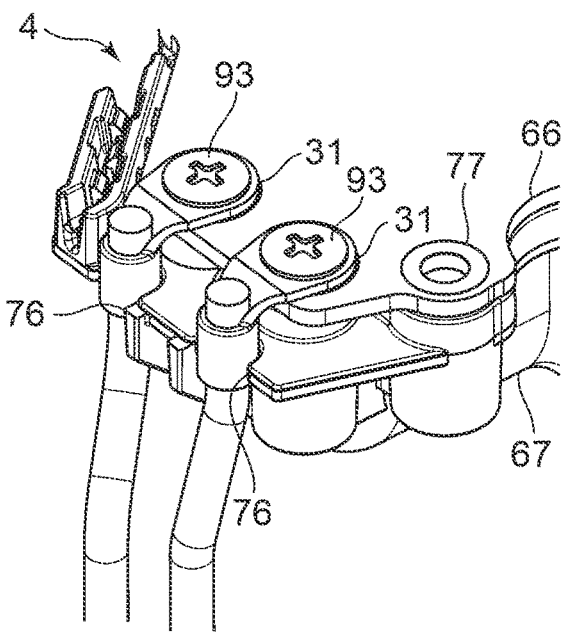
FIG. 30 is an enlarged perspective view of a state in which the power source side connection terminals are attached to the filter circuit section of FIG. 14.
Figure 31:
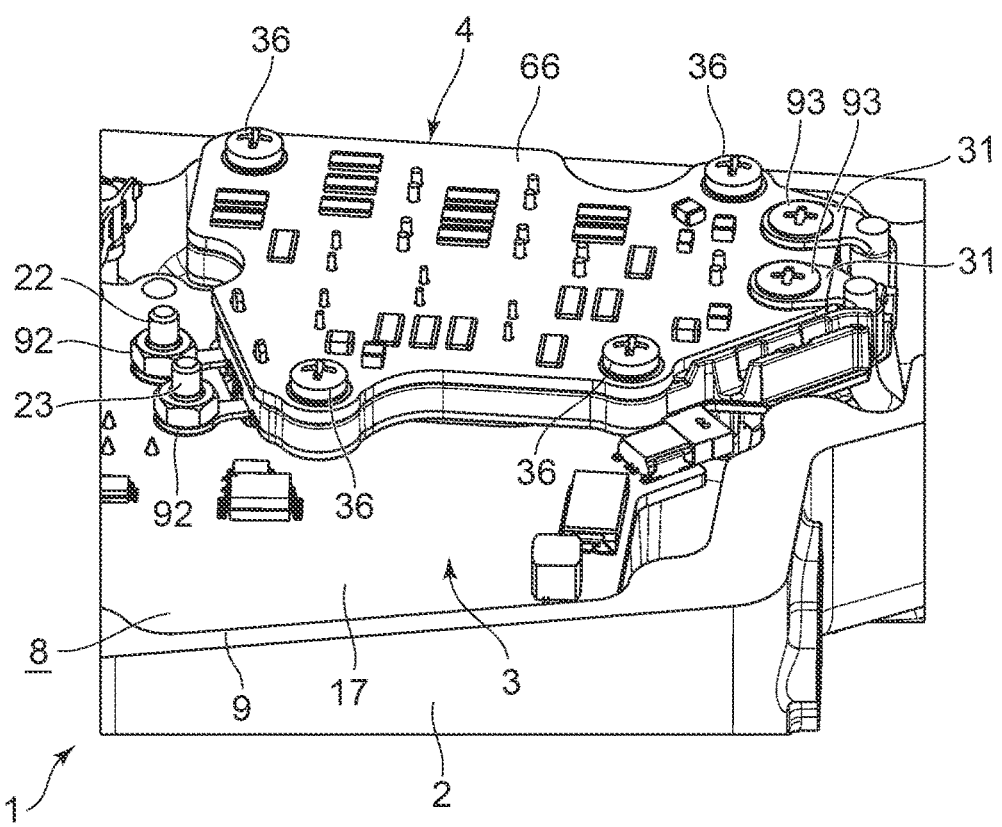
FIG. 31 is a perspective view of the filter circuit section of the inverter storing section in the state in which the power source side connection terminals shown in FIG. 29 are attached.

At this time, the power source side connection terminals 31 respectively enter into and are held by the guide portions 76 formed on the support member 67 (FIG. 30). Thereby, since the positional displacement of each power source side connection terminal 31 is restricted, screwing workability is also improved, and the insulation distance between the power source side connection terminals 31 is also secured (FIG. 31). Then, finally, the lid member 11 is detachably attached to the opening 9 of the inverter storing section 8, and the opening 9 of the inverter storing section 8 is closed in an openable/closable manner (FIG. 1).

As described above, there has been adopted the structure in which the inverter control board 17, the sleeve assembly 18, and the power module 14 of the inverter circuit section 3 are integrated and the filter circuit board 66 and the support member 67 of the filter circuit section 4 are integrated, and the inverter circuit section 3 and the filter circuit section 4 are stored each individually in the inverter storing section 8 from the same direction and detachably attached to the housing 2. Therefore, the inverter circuit section 3 and the filter circuit section 4 can be stored each separately in the inverter storing section 8, whereby the degree of freedom in the assembling process when the inverter circuit section 3 and the filter circuit section 4 are attached to the housing 2 can be increased, and the assembly workability of the electric compressor 1 can be improved.

In this case, since the soldering of the inverter circuit section 3, the soldering of the filter circuit section 4, and the resin filling can be performed in the sub line before the assembly to the housing 2, man-hours in the main line can be reduced. Further, since the inverter circuit section 3 and the filter circuit section 4 are provided separately, the degree of freedom in design is increased in their arrangement, and the space for the inverter storing section 8 can be saved. Furthermore, since the relatively large filter circuit section 4 is provided separately from the inverter circuit section 3, vibration resistance is also improved, and the filter circuit section 4 is extremely suitable as for an electric compressor used in a vehicle air conditioning device.

In particular, since the inverter circuit section 3 and the filter circuit section 4 can be stored in the inverter storing section 8 from the same direction, there is no need to change the orientation of the housing 2 when attaching the inverter circuit section 3 and the filter circuit section 4 to the housing 2, and the assembly work becomes even better.

For example, as in the embodiment, the inverter storing section 8 is constituted on one end side of the housing 2 in the axial direction of the rotating shaft 5 of the motor 6, and the inverter circuit section 3 and the filter circuit section 4 are stored each individually in the inverter storing section 8 from the axial direction of the rotating shaft 5 of the motor 6 and detachably attached to the housing 2. Consequently, the inverter circuit section 3 and the filter circuit section 4 can be easily installed in the inverter storing section 8 from above with the one end side of the housing 2 facing upward as described above.

Further, in the embodiment, the motor side connection terminals 28 connected to the lead terminals 24 to 26 of the motor 6 and the filter side connection terminals 71 of the filter circuit section 4 are fixed to the terminal connection portions 19 to 23 of the sleeve assembly 18, respectively, and electrically connected to the inverter control board 17. Therefore, the electrical connection of the inverter control board 17, the motor 6, and the filter circuit section 4 can also be performed without any trouble.

In this case, the motor side connection terminals 28 connected to the inverter control board 17 and the lead terminals 24 to 26 of the motor 6 are jointly fastened to the terminal connection portions 19 to 23 by the nuts 91 screwed into the screw groove portions 34, and the inverter control board 17 and the lead terminals 24 to 26 are electrically connected. Consequently, the motor side connection terminals 28 connected to the lead terminals 24 to 26 of the motor 6 can be connected to the inverter control board 17 with a highly rigid connection structure.

Further, in the embodiment, each of the terminal connection portions 19 to 23 is constituted of the male screw having the screw groove portion 34, the sleeve assembly 18 is taken to be resin-molded, and the respective terminal connection portions 19 to 23 are integrally resin-molded in the protruded state of each screw groove portion 34. Therefore, the rigidity of the sleeve assembly 18 and the terminal connection portions 19 to 23 is increased, and the vibration resistance is remarkably improved.

Then, as in the embodiment, the motor side connection terminals 28 and the filter side connection terminals 71 are fastened to the respective terminal connection portions 19 to 23 via the inverter control board 17 by the nuts 91 and 92 screwed into the screw groove portions 34 of the terminal connection portions 19 to 23. Thus, the motor side connection terminals 28 and the filter side connection terminals 71 can be firmly fastened to improve the connection strength and rigidity and to make a constitution resistant to vibration.

Further, the sleeve 32 is integrated with the sleeve assembly 18 by integrally resin-molding the sleeve 32 into which the bolt 36 for fixing the inverter circuit section 3 to the housing 2 is inserted in the sleeve assembly 18 as in the embodiment. Thus, the number of components can be reduced and the rigidity of the inverter circuit section 3 can be improved.

Furthermore, the terminal connection portions 19 to 21 having the screw groove portions 34 are protrusively provided on the inverter circuit section 3, the motor side connection terminals 28 are provided with the flat plate terminal portions 88, and the flat plate terminal portions 88 are fixed to the inverter control board 17 of the inverter circuit section 3 by the nuts 91 each screwed into the screw groove portion 34 of the terminal connection portions 19 to 21, whereby they are electrically connected to the inverter circuit section 3. Consequently, the motor side connection terminals 28 and the inverter circuit section 3 are mechanically fastened, and the connection strength between the motor side connection terminals 28 and the inverter circuit section 3 can be maintained even when an external force is applied by vibration or heat or the like.

Thus, it is possible to effectively eliminate the occurrence of poor connection due to a reduction in holding force accompanying a creep phenomenon. Further, the terminal connection portions 19 to 21 are resin-molded integrally with the sleeve assembly 18 with the screw groove portions 34 being protruded. The screw groove portions 34 passes through the inverter control board 17 to protrude therethrough, and the nuts 91 are screwed into the screw groove portions 34 of the terminal connection portions 19 to 21, whereby the flat plate terminal portions 88 of the motor side connection terminals 28 are respectively sandwiched between the nuts 91 and the inverter control board 17, and in this state, the flat plate terminal portions 88 are electrically connected to the inverter control board 17. It is therefore possible to improve the strength and rigidity of the inverter circuit section 3 around the terminal connection portions 19 to 21 to which the motor side connection terminals 88 are connected.

Further, since the motor side connection terminals 28 are provided with the pressure contact terminal portions 89 which are in pressure contact with and electrically connected to the lead terminals 24 to 26 of the motor 6, the side of the lead terminals 24 to 26 is subjected to pressure contact as in the related art to enable the motor side connection terminals 28 to be easily connected thereto.

In this case, in the embodiment, since the terminal connection portions 19 to 21 protrude in the same direction as the lead terminals 24 to 26 in the state in which the inverter circuit section 3 is stored in the inverter storing section 8, the direction in which the pressure contact terminal portions 89 of the motor side connection terminals 28 are connected to the lead terminals 24 to 26 of the motor 6 by pressure contact, and the direction in which the flat plate terminal portions 88 are fixed to the terminal connection portions 19 to 21 of the inverter circuit section 3 with the nuts 91 coincide (connection and fixing from above), so that the work of assembling the motor side connection terminals 28 is improved.

Also, in the embodiment, since the sleeve assembly 18 is provided with the positioning pins 39 for the housing 2, the positioning with the housing 2 when the inverter circuit section 3 is attached to the inverter storing section 8 can be easily performed.

Further, as described above, the sleeves 68 each having the predetermined length dimension through which the bolts 36 for fixing the filter circuit section 4 to the housing 2 are inserted are resin-molded integrally with the support member 67 of the filter circuit section 4, and the filter circuit section 4 is fixed to the housing 2 by the bolts 36 in the state in which the sleeves 68 are in contact with the housing 2. Therefore, the position where the filter circuit section 4 contacts the housing 2 approaches the partition wall 12 side of the housing 2 by the length dimension of the sleeve 68 as shown in FIG. 3. Consequently, it is possible to reduce the vibration of the filter circuit section 4 when vibration during traveling of the vehicle is applied to the electric compressor 1 and suppress inconvenience that breakage occurs in each part.

In particular, as in the embodiment, the end of each sleeve 68 on the housing 2 side is positioned in the center in the height direction of the filter circuit section 4 or the region in the vicinity of its center, thereby making it possible to effectively reduce the vibration of the filter circuit section 4 when the vibration is applied.

Incidentally, the shapes and structures of the inverter circuit section 3, the filter circuit section 4, and the housing 2 shown in the embodiment are not limited to those, and needless to say, various changes can be made within the scope not departing from the spirit of the present invention.

DESCRIPTION OF REFERENCE NUMERALS 1 electric compressor
2 housing
3 inverter circuit section
4 filter circuit section (electric circuit section)
6 motor
8 inverter storing section
12 partition wall
13 power switching element
14 power module
16 control circuit
17 inverter control board
18 sleeve assembly
19 to 23 terminal connection portion
24 to 26 lead terminal
28 motor side connection terminal (connection terminal)
31 power source side connection terminal (connection terminal)
32, 68 sleeve
34 screw groove portion
36 bolt
37 to 39, 74 positioning pin
43 installation plate
47 male screw
49 resin coating material
52 insulating sheet
54, 91, 92 nut
63 smoothing capacitor (electric component)
64 coil (electric component)
66 filter circuit board (circuit board)
67 support member
69 nut member
71 filter side connection terminal (connection terminal)
88 flat plate terminal portion
89 pressure contact terminal portion
93 screw.

The invention claimed is:

1. An electric compressor with inverter circuit section and filter circuit section, comprising:
a housing having a motor incorporated therein;
an inverter circuit section for supplying power to the motor; and
a filter circuit section for absorbing a high frequency component of a switching current,
wherein the inverter circuit section and the filter circuit section are installed in an inverter storing section constituted on an outer surface of the housing,
wherein the inverter circuit section includes an inverter control board on which a control circuit is mounted, a sleeve assembly having a plurality of terminal connection portions, and a power module on which power switching elements are mounted, and the inverter control board, the sleeve assembly, and the power module are integrated, wherein the filter circuit section includes a filter circuit board on which electric components are mounted, and a support member made of a hard resin which stores the electric components, a filter side connection terminal is integrally resin-molded on the support member, and the filter circuit board and the support member are integrated by filling a thermosetting resin in the support member in a state in which the electric components are stored in the support member, and the filter side connection terminal is soldered to the filter circuit board to be electrically connected to the filter circuit board, wherein the inverter circuit section and the filter circuit section are structured to be capable of being stored each individually in the inverter storing section from the same direction and detachably attached to the housing, and wherein a motor side connection terminal connected to a lead terminal of the motor and a filter side connection terminal of the filter circuit section are respectively fixed to the plurality of terminal connection portions of the sleeve assembly and electrically connected to the inverter control board.

2. The electric compressor according to claim 1, wherein the inverter storing section is constituted on one end side of the housing in the axial direction of the motor, and the inverter circuit section and the filter circuit section are structured to be capable of being stored each individually in the inverter storing section from the axial direction of the motor and detachably attached to the housing.

3. The electric compressor according to claim 1, wherein each of the terminal connection portions is comprised of a male screw having a screw groove portion, and wherein the sleeve assembly is resin-molded, and the terminal connection portions are integrally resin-molded in a state in which the screw groove portions are protruded.

4. The electric compressor according to claim 3, wherein the motor side connection terminal and the filter side connection terminal are fastened to the terminal connection portions via the inverter control board by nuts screwed into the screw groove portions of the terminal connection portions.

5. The electric compressor according to claim 3, wherein sleeves through which bolts for fixing the inverter circuit section to the housing are inserted are integrally resin-molded in the sleeve assembly.

* * * * *